US011436177B2

(12) United States Patent
Smith et al.

(10) Patent No.: US 11,436,177 B2
(45) Date of Patent: Sep. 6, 2022

(54) FLOATING DEVICE LOCATION IDENTIFICATION SYSTEM

(71) Applicant: Dell Products L.P., Round Rock, TX (US)

(72) Inventors: William Andrew Smith, Round Rock, TX (US); Robert G. Bassman, The Village of The Hills, TX (US); Salvador Jimenez, III, Leander, TX (US); Sanjiv Sinha, Austin, TX (US); Noman Mithani, Fairview, TX (US)

(73) Assignee: Dell Products L.P., Round Rock, TX (US)

( * ) Notice: Subject to any disclaimer, the term of this patent is extended or adjusted under 35 U.S.C. 154(b) by 6 days.

(21) Appl. No.: 16/937,726

(22) Filed: Jul. 24, 2020

(65) Prior Publication Data

US 2022/0027302 A1    Jan. 27, 2022

(51) Int. Cl.
  *G06F 13/40*     (2006.01)
  *H05K 7/14*      (2006.01)

(52) U.S. Cl.
  CPC ....... *G06F 13/4068* (2013.01); *H05K 7/1485* (2013.01)

(58) Field of Classification Search
  None
  See application file for complete search history.

(56) References Cited

U.S. PATENT DOCUMENTS

| | | | | | |
|---|---|---|---|---|---|
| 5,831,821 | A  * | 11/1998 | Scholder | ................. | G06F 1/184 361/679.32 |
| 6,261,104 | B1 * | 7/2001  | Leman    | .................... | G06F 1/184 439/61 |
| 8,356,270 | B2 * | 1/2013  | Burd     | .....................  | G06F 30/367 716/136 |
| 8,625,596 | B1 * | 1/2014  | Thomas   | .............. | H04L 41/0876 370/392 |
| 8,868,957 | B2 * | 10/2014 | Davis    | ........................ | G06F 1/30 713/340 |
| 9,629,291 | B1 * | 4/2017  | Chen     | ....................... | H05K 13/04 |
| 10,028,403 | B1 * | 7/2018 | Hartman  | ................ | H05K 7/142 |

(Continued)

*Primary Examiner* — Henry Tsai
*Assistant Examiner* — Christopher A Bartels
(74) *Attorney, Agent, or Firm* — Joseph Mencher

(57) ABSTRACT

A floating device location identification system includes a chassis defining floating device housings and including respective chassis location identification features adjacent each floating device housing that identify the relative location of that floating device housing. A floating device may be positioned in a first floating device housing and adjacent a first chassis location identification feature. The first floating device includes floating device cabling connector(s) that are connected via a cabling subsystem to a device location identification subsystem, and chassis engagement elements that are coupled to the floating device cabling connector(s) and that engage the first chassis location identification feature. The floating device transmits floating device location identifying information to the device location identification subsystem that is based on the engagement of the chassis engagement elements and the first chassis location identification feature, and that identifies a relative location of the first floating device housing in the chassis.

20 Claims, 17 Drawing Sheets

(56) References Cited

U.S. PATENT DOCUMENTS

| | | | |
|---|---|---|---|
| 10,957,999 B1* | 3/2021 | Norton | H01R 25/003 |
| 2008/0055876 A1* | 3/2008 | Fan | G06F 1/185 |
| | | | 361/801 |
| 2008/0225856 A1* | 9/2008 | Kawamura | H04L 12/40 |
| | | | 370/395.3 |
| 2011/0271610 A1* | 11/2011 | Cottuli | H05K 7/20745 |
| | | | 52/173.1 |
| 2013/0097600 A1* | 4/2013 | Cardona | G06F 9/45558 |
| | | | 718/1 |
| 2014/0108827 A1* | 4/2014 | Mathew | H05K 7/1498 |
| | | | 713/300 |
| 2016/0154756 A1* | 6/2016 | Dodson | G06F 13/4022 |
| | | | 710/316 |
| 2017/0187846 A1* | 6/2017 | Shalev | H04L 49/90 |
| 2017/0202369 A1* | 7/2017 | Mercier | G01B 21/16 |
| 2017/0212784 A1* | 7/2017 | Johnsen | H04L 67/10 |
| 2019/0018698 A1* | 1/2019 | Wang | G06F 9/45558 |
| 2021/0076529 A1* | 3/2021 | Pachoud | H05K 7/1492 |
| 2021/0117360 A1* | 4/2021 | Kutch | G06F 9/5083 |
| 2021/0232528 A1* | 7/2021 | Kutch | G06F 9/45558 |

* cited by examiner

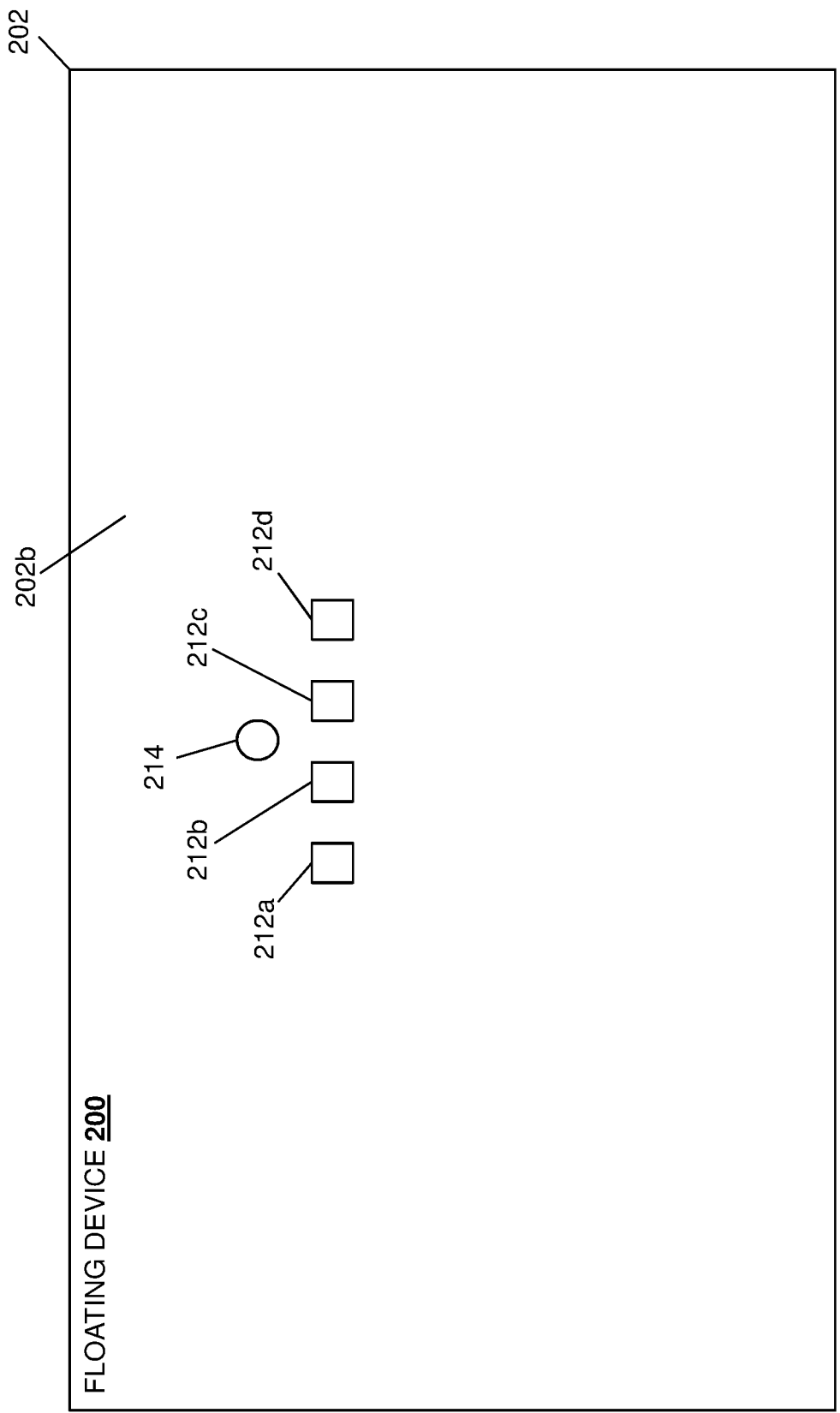

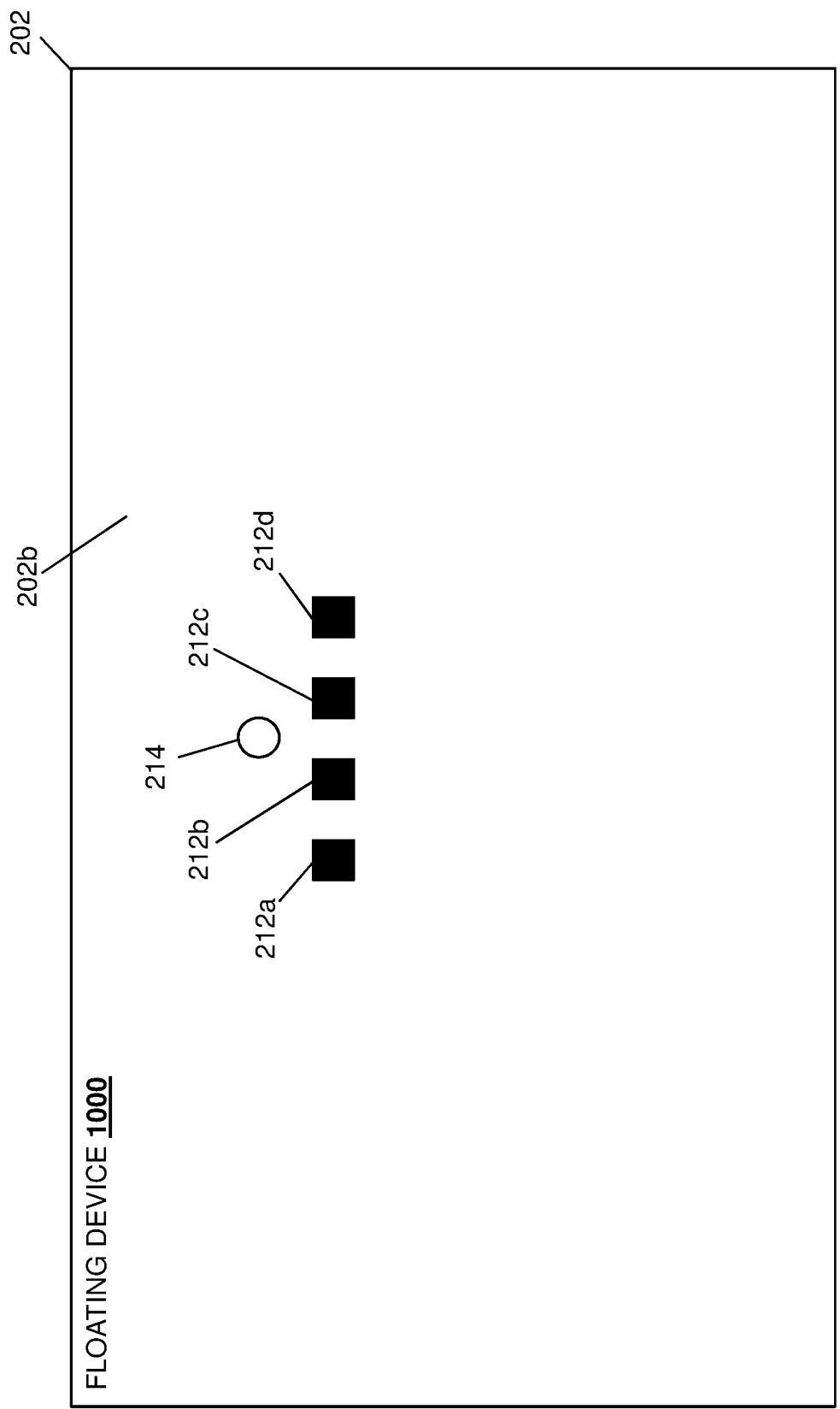

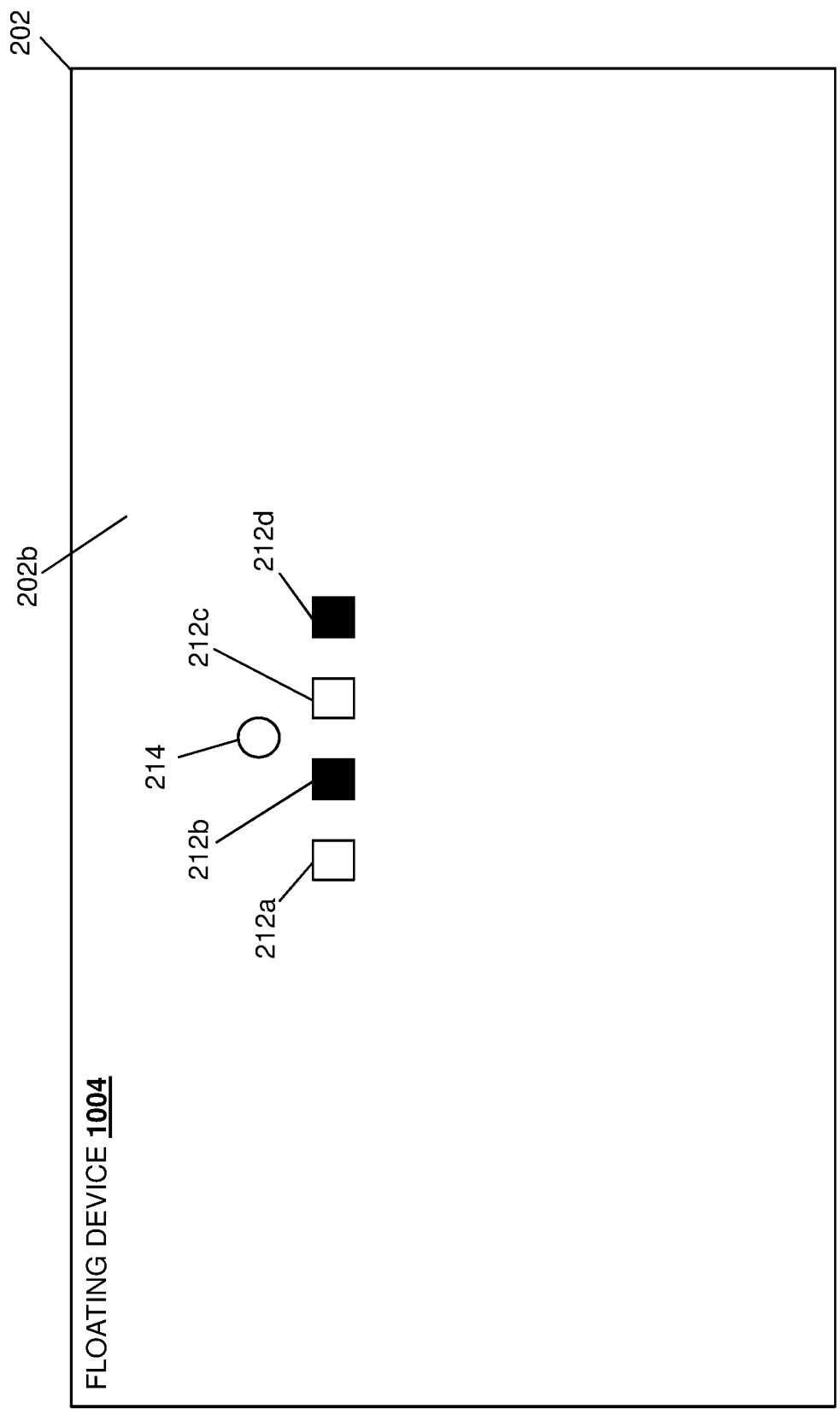

FLOATING DEVICE LOCATION IDENTIFICATION SYSTEM

BACKGROUND

The present disclosure relates generally to information handling systems, and more particularly to identifying the locations of floating devices in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server computing devices, may be provided with "floating" devices that may be positioned in any of a variety of locations within a chassis of the server computing device. For example, one trend in server computing devices is to replace the traditional card edge/connector slot connections of riser cards to motherboards in the chassis of the computing device with cabled connections that allow for higher speed, higher integrity signal transmission. The use of such cabled connections allows the riser cards to "float" within the chassis of the computing device and be mounted to different locations within that chassis. However, the use of such "floating" riser cards introduces challenges for factory assembly, service, and server management, particularly with regard to high volume server production. For example, the riser cards discussed above may include riser connector slots to which add-in cards may be connected, and the configuration of those riser connector slots is conventionally defined by the traditional riser card edge/motherboard connector slot connections discussed above (as well as the physical construction of the riser card). As will be appreciated by one of skill in the art in possession of the present disclosure, the use of the riser card/motherboard cabled connections discussed above eliminates location identification that is enabled in conventional server computing devices via the direct connection of the riser cards to the fixed motherboard connector slots.

Accordingly, it would be desirable to provide a floating device location identification system that addresses the issues discussed above.

SUMMARY

According to one embodiment, an Information Handling System (IHS) includes a chassis; a plurality of floating device housings defined by the chassis; a respective chassis location identification feature that is located adjacent each floating device housing and that is configured to identify the relative location of that floating device housing in the chassis; a processing system that is housed in the chassis; and a memory system that is coupled to the processing system and that includes instructions that, when executed by the processing system, cause the processing system to provide a device location identification engine that is configured to: receive, from a first floating device that is positioned in a first floating device housing defined by the chassis and adjacent to a first chassis location identification feature that is included in the chassis adjacent to the first floating device housing, first floating device location identifying information that is based on the engagement of a plurality of first chassis engagement elements on the first floating device and the first chassis location identification feature; and identify, based on the first floating device location identifying information, a relative location of the first floating device in the chassis.

BRIEF DESCRIPTION OF THE DRAWINGS

FIG. 2B is a schematic rear view illustrating an embodiment of the floating device of FIG. 2A.

FIG. 10B is a schematic view illustrating an embodiment of one of the floating devices located in the chassis in FIG. 10A.

FIG. 10D is a schematic view illustrating an embodiment of one of the floating devices located in the chassis in FIG. 10A.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
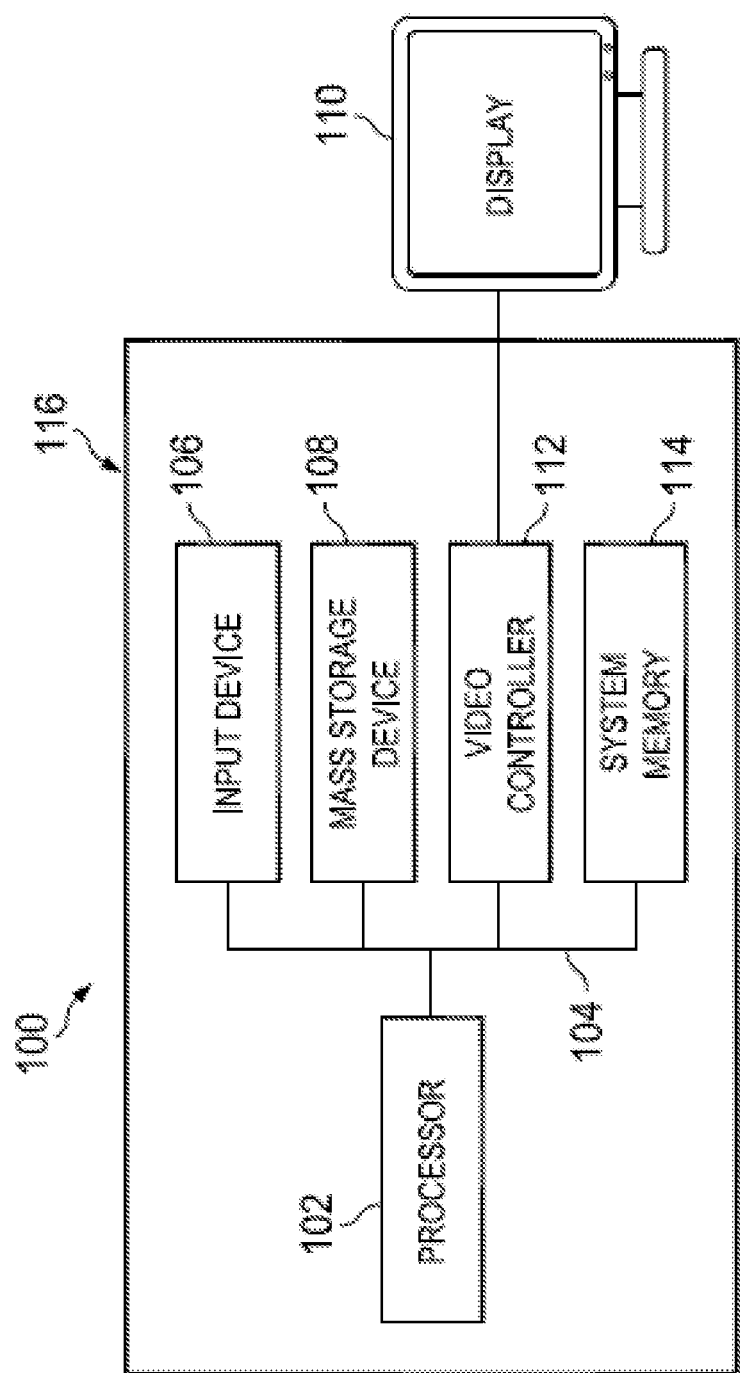
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
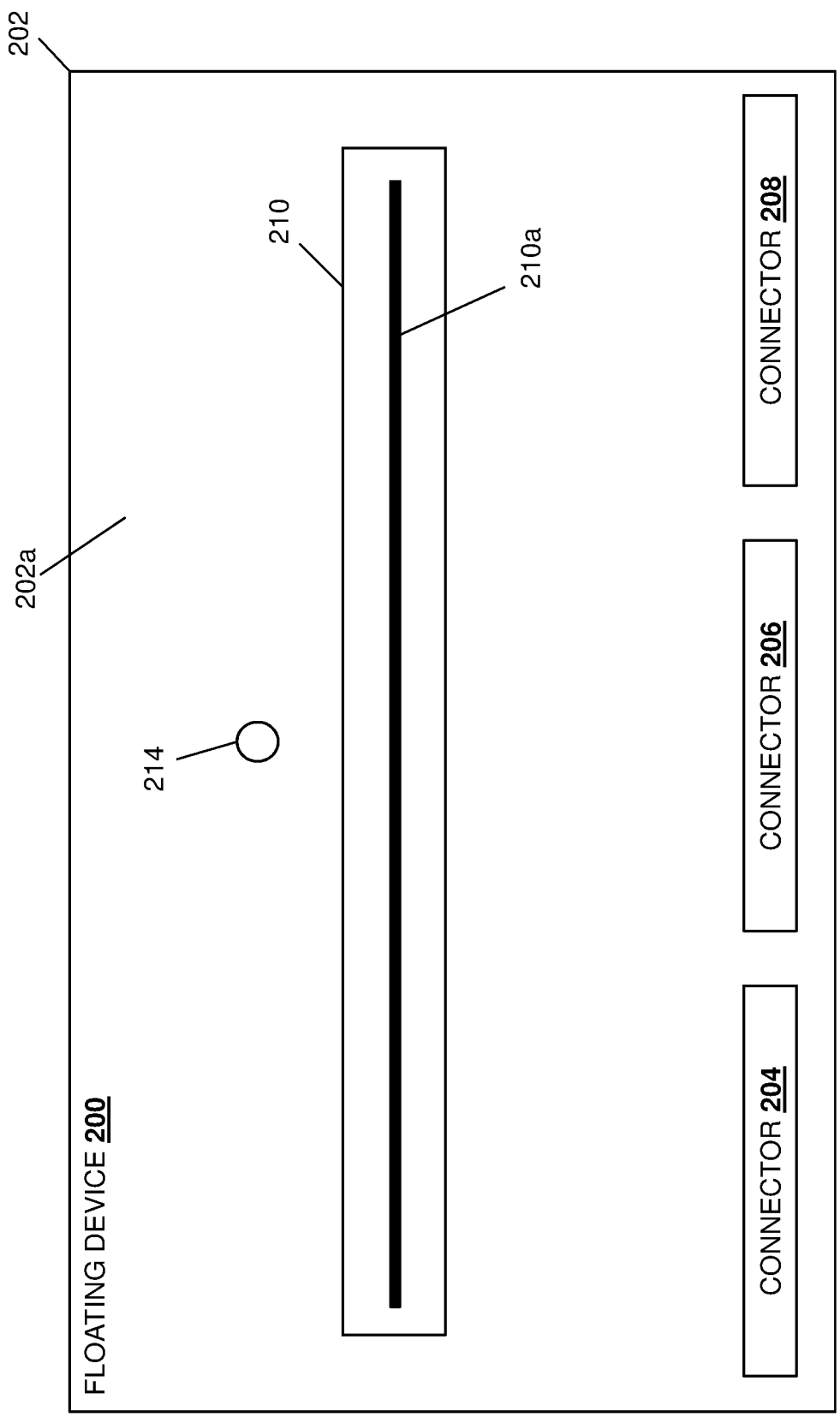
FIG. 2A is a schematic front view illustrating an embodiment of a floating device.

Referring now to FIGS. 2A and 2B, an embodiment of a floating device 200 that may be utilized with the floating device location identification system of the present disclosure is illustrated. In the embodiments illustrated and discussed below, the floating device 200 is provided by a riser card that is configured to be cabled to a motherboard in a chassis, as well as connected to add-in cards in order to couple those add-in cards to the motherboard and other components in the chassis. However, while described as being provided by a riser card, one of skill in the art in possession of the present disclosure will appreciate that floating devices utilizing the floating device location identification system of the present disclosure may include other circuit boards, backplanes, POWEREDGE® Redundant Array of Independent Disk (RAID) Controllers (PERCs) available from DELL® Inc. of Round Rock, Tex., United States, battery systems, and other any other floating device known in the art. In the illustrated embodiment, the floating device 200 includes a chassis 202 that, in the embodiments described herein, is provided by a circuit board that supports the components of the floating device 200, only some of which are illustrated and discussed below. As can be seen in FIGS. 2A and 2B, the chassis 202 includes a front surface 202*a*, and a rear surface 202*b* that is located opposite the chassis 202 from the front surface 202*a*.

In the illustrated embodiment, the floating device 200 includes a plurality of floating device connectors 204, 206, and 208, each of which is mounted to the front surface 202*a* of the chassis 202. In the examples below, the floating device connectors 204 and 206 are provided by High Speed Input/Output (HSIO) cabling subsystem connectors that may be configured to transmit Peripheral Component Interconnect express (PCIe) signals, while the connector 208 is provided by a power signal connector that may be configured to transmit sideband signals. However, while a particular number and particular types of connectors are illustrated and described below, one of skill in the art in possession of the present disclosure will recognize that different numbers and/or types of connectors may be included on the floating device 200 while remaining within the scope of the present disclosure as well. In the illustrated embodiment, an add-in card connector 210 including an add-in card connector slot 210*a* is also mounted to the front surface 202*a* of the chassis 202 and, while not illustrated below, one of skill in the art in possession of the present disclosure will recognize that add-in cards may be connected to the floating device 200 via the add-in card connector slot 210*a* on the add-in card connector 210.

In the illustrated embodiment, a plurality of chassis engagement elements 212*a*, 212*b*, 212*c*, and 212*d* are included on the rear surface 202*b* of the chassis 202 in a spaced apart orientation from each other. In different embodiments, the chassis engagement elements 212*a*-212*d* may be provided by contact surfaces, spring elements, grounding clips, and/or other elements that one of skill in the art in possession of the present disclosure will appreciate will provide for the functionality discussed below. In the examples below, the chassis engagement elements 212*a*-212*d* are provided by conductive grounding elements that may operate to ground the floating device 200 while also providing for the floating device location identification functionality discussed below, but one of skill in the art in possession of the present disclosure will appreciate that the grounding functionality discussed below is optional, and the operation of the chassis engagement elements 212*a*-212*d* to enable the floating device location identification functionality discussed below may be provided in a variety of manners that will fall within the scope of the present disclosure as well. As discussed below, the chassis engagement elements 212*a*-212*d* may be coupled to one or more of the floating device connectors 204, 206, and/or 208 in different manners.

In the illustrated embodiment, a mounting aperture 214 is defined by the chassis 202 and extends through the chassis 202 from the front surface 202*a* to the rear surface 202*b*. However, while a single mounting aperture 214 is illustrated and described in a particular position, one of skill in the art in possession of the present disclosure will appreciate that different numbers and/or types of mounting features (e.g., mounting/grounding features) may be provided on the floating device 200 in different locations while remaining within the scope of the present disclosure as well. Thus, while a specific floating device 200 has been illustrated and described, one of skill in the art in possession of the present disclosure will recognize that floating devices provided in the floating device location identification system of the present disclosure may include a variety of components and component configurations while remaining within the scope of the present disclosure as well.

Figure 3:
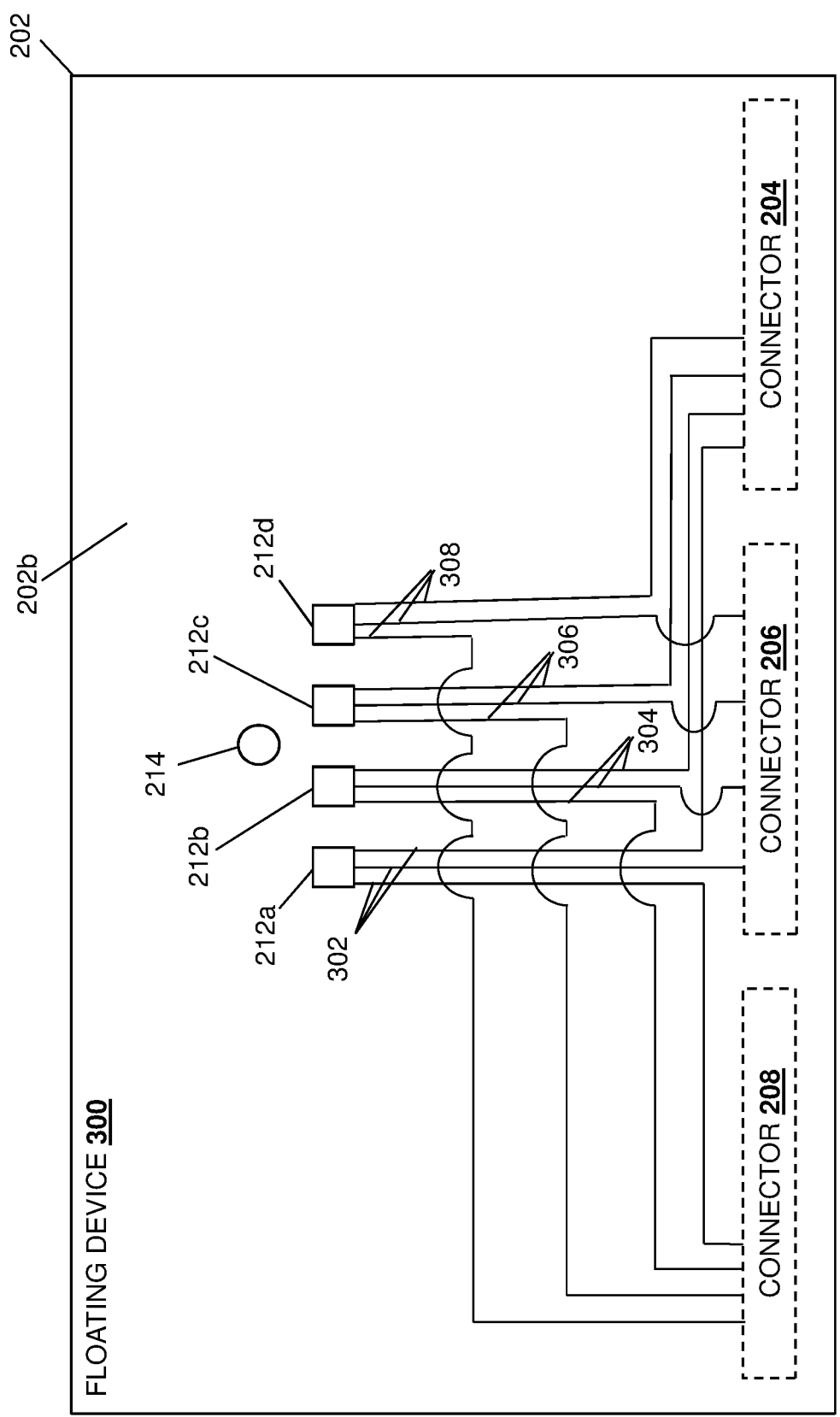
FIG. 3 is a schematic view illustrating an embodiment of the floating device of FIGS. 2A and 2B.

Referring now to FIG. 3, an embodiment of a floating device 300 is illustrated that is substantially similar to the floating device 200 discussed above with reference to FIG. 2 (and thus includes similar element numbers for similar features), and that is provided to describe a particular coupling configuration between the chassis engagement elements 212a-212d and the floating device connectors 204, 206, and/or 208. As can be seen in FIG. 3, the floating device 300 provides the chassis engagement element 212a connected to each of the connectors 204, 206, and 208 via respective traces 302 that extend through the chassis 202; the chassis engagement element 212b connected to each of the connectors 204, 206, and 208 via respective traces 304 that extend through the chassis 202; the chassis engagement element 212c connected to each of the connectors 204, 206, and 208 via respective traces 306 that extend through the chassis 202; and the chassis engagement element 212d connected to each of the connectors 204, 206, and 208 via respective traces 308 that extend through the chassis 202. As discussed in further detail below, the coupling configuration between the chassis engagement elements 212a-212d and the floating device connectors 204, 206, and/or 208 in the floating device 300 of FIG. 3 allows for a device location identification subsystem that is external to the floating device 300 and connected to one or more of the connectors 204, 206, and 208 to identify the engagement of the chassis engagement element(s) 212a-212d with a computing device chassis.

Figure 4:
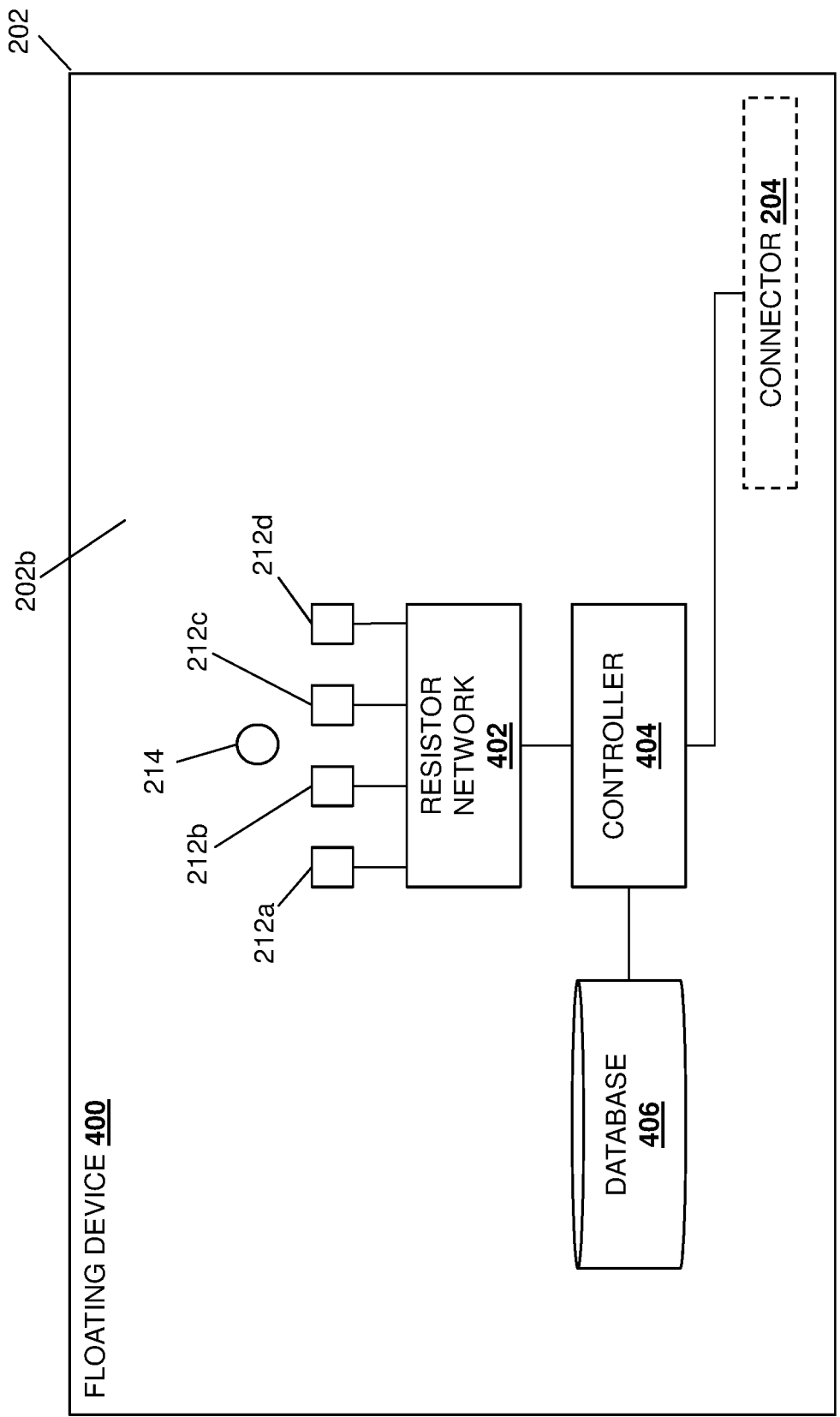
FIG. 4 is a schematic view illustrating an embodiment of the floating device of FIGS. 2A and 2B.

Referring now to FIG. 4, an embodiment of a floating device 400 is illustrated that is substantially similar to the floating device 200 discussed above with reference to FIG. 2 (and thus includes similar element numbers for similar features), and that is provided to describe a particular coupling configuration between the chassis engagement elements 212a-212d and the floating device connector 204. As can be seen in FIG. 4, the floating device 400 includes a resistor network 402 that is connected (e.g., via traces in the chassis 202) to each of the chassis engagement elements 212a-212d, a controller 404 that is connected (e.g., via trace(s) in the chassis 202) to the resistor network 402 and the connector 204, and a storage device (not illustrated) that includes a database 406 and that that is connected (e.g., via traces in the chassis 202) to the controller 404. As discussed in further detail below, the coupling configuration between the chassis engagement elements 212a-212d and the floating device connector 204 in the floating device 400 of FIG. 4 allows for the controller 404 to identify the engagement of the chassis engagement element(s) 212a-212d with a computing device chassis, and report those engagement(s) to a device location identification subsystem that is external to the floating device 400. As such, the controller 404 may include a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a controller engine that is configured to perform the functionality of the controller engines and/or controllers discussed below.

However, while FIGS. 3 and 4 illustrate and describe particular coupling configurations between chassis engagement elements on a floating device and floating device connector(s) on that floating device, one of skill in the art in possession of the present disclosure will appreciate that the device location identification functionality described herein with regard to the engagement of the chassis engagement element on the floating device with a chassis in which that floating device is positioned may be accomplished in a variety of manners that will fall within the scope of the present disclosure as well. For example, while the chassis engagement elements 212a-212d illustrated and described herein provide four binary information reporting elements, one of skill in the art in possession of the present disclosure that the unique location reporting accomplished by the chassis engagement elements 212a-212d discussed below may be replaced using other unique information reporting techniques (e.g., varying resistance elements, additional information reporting elements, etc.) while remaining within the scope of the present disclosure as well.

Figure 5:
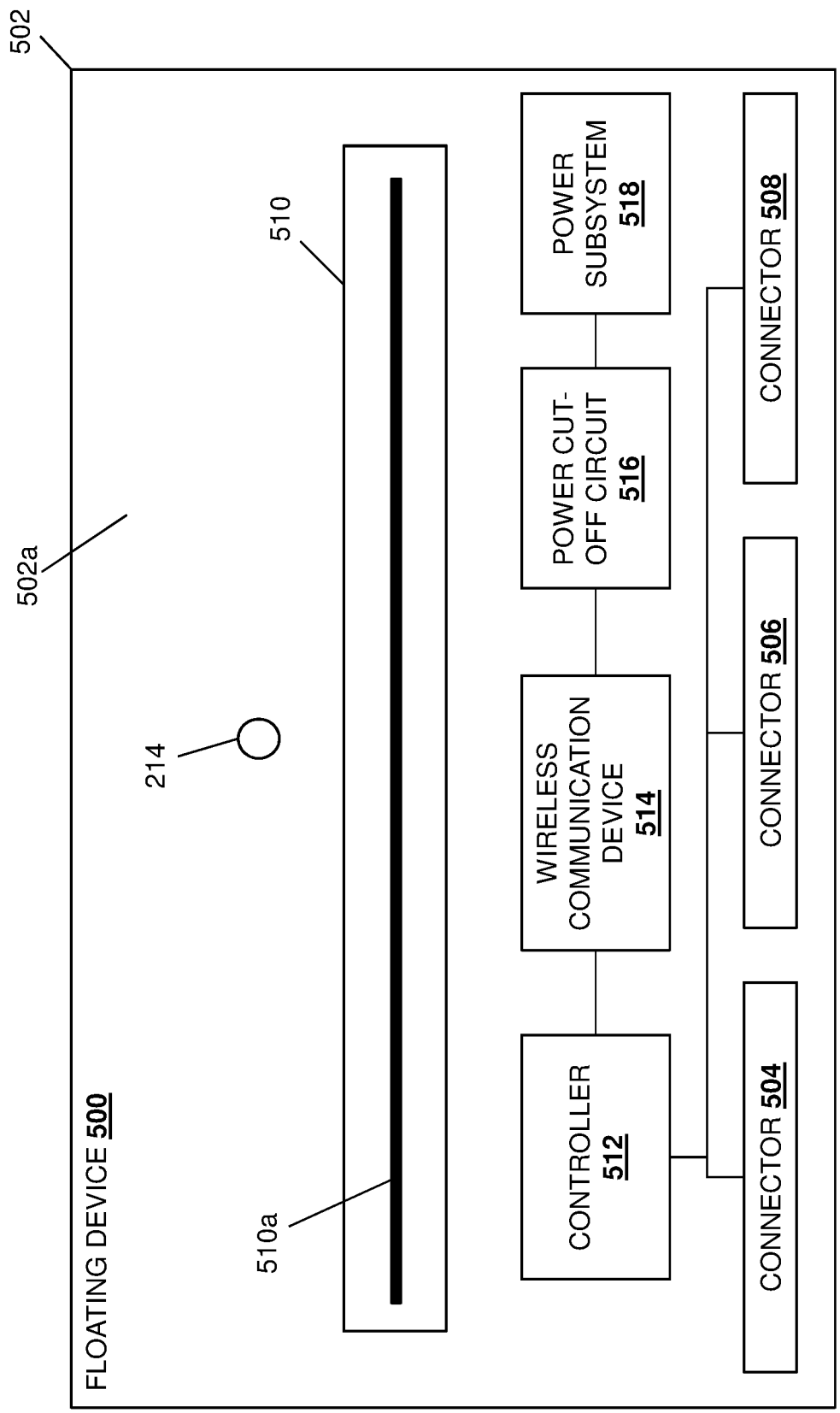
FIG. 5 is a schematic view illustrating an embodiment of a floating device.

Referring now to FIG. 5, an embodiment of a floating device 500 that may be utilized with the floating device location identification system of the present disclosure is illustrated. In the embodiments illustrated and discussed below, the floating device 500 is provided by a riser card that is configured to be cabled to a motherboard in a chassis, as well as to connect to add-in cards in order to couple those add-in cards to the motherboard and other components in the chassis. However, while described as a riser card, one of skill in the art in possession of the present disclosure will appreciate that floating devices utilizing the floating device location identification system of the present disclosure may include other circuit boards, backplanes, POWEREDGE® Redundant Array of Independent Disk (RAID) Controllers (PERCs) available from DELL® Inc. of Round Rock, Tex., United States, battery systems, and other any other floating device known in the art. In the illustrated embodiment, the floating device 500 includes a chassis 502 that, in the embodiments described herein, is provided by a circuit board that supports the components of the floating device 500, only some of which are illustrated and discussed below. As can be seen in FIG. 5, the chassis 502 includes a front surface 502a.

In the illustrated embodiment, the floating device 500 includes a plurality of floating device connectors 504, 506, and 508, each of which is mounted to the front surface 502a of the chassis 502. In the examples below, the floating device connectors 504 and 506 are provided by High Speed Input/Output (HSIO) cabling subsystem connectors that may be configured to transmit Peripheral Component Interconnect express (PCIe) signals, while the connector 508 is provided by a power signal connector that may be configured to transmit sideband signals. However, while a particular number and particular types of connectors are illustrated and described below, one of skill in the art in possession of the present disclosure will recognize that different numbers and/or types of connectors may be included on the floating device 500 while remaining within the scope of the present disclosure as well. In the illustrated embodiment, an add-in card connector 510 including an add-in card connector slot 510a is also mounted to the front surface 502a of the chassis 502 and, while not illustrated below, one of skill in the art in possession of the present disclosure will recognize that add-in cards may be connected to the floating device 500 via the add-in card connector slot 510a on the add-in card connector 510.

A controller 512 is mounted to the front surface 502a of the chassis 502, and connected (e.g., via trace(s) in the chassis 502) to each of the floating device connectors 504, 506, and 508. Furthermore, a wireless communication device 514 is also mounted to the front surface 502a of the chassis 502 and coupled to the controller 512 (e.g., via trace(s) in the chassis 502, included on the controller 512, etc.) In a specific example, the wireless communication device 514 may include a BLUETOOTH® Low Energy (BLE) wireless communication device that, as discussed below, may be configured to transmit location identification signals that may include wireless transmission characteristics such as, for example, transmission angles, transmission strengths, and/or other transmission characteristics that may be utilized to identify a location from which that location identification signal was transmitted. Furthermore, the wireless communication device 514 may be isolated on a dedicated power rail coupled to a power subsystem 518, and coupled via a power cut-off circuit 516 to the power subsystem 518, in order to allow the power cut-off circuit 516 to cut-off power from the power subsystem 518 to the wireless communication device 514 after some time period. As discussed below, the floating device 500 may be utilized to provide wireless floating device location identification functionality in the floating device location identification system of the present disclosure. However, while a specific floating device 500 is illustrated, one of skill in the art in possession of the present disclosure will recognize that the floating device 500 may include a variety of components and/or configurations to enable the wireless floating device location identification functionality discussed below while remaining within the scope of the present disclosure as well.

Figure 6:
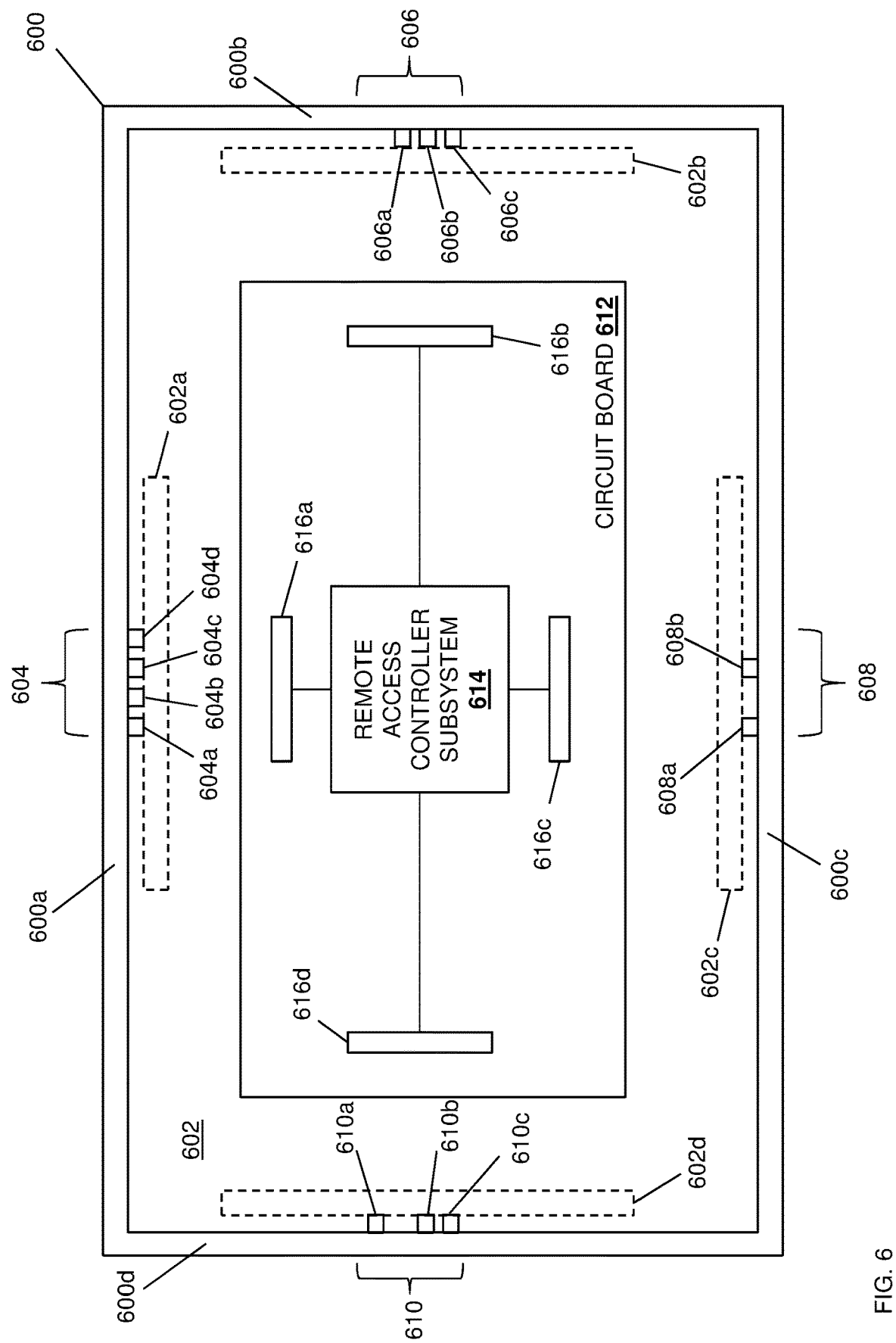
FIG. 6 is a schematic view illustrating an embodiment of a chassis that may house the floating device of FIGS. 2A, 2B, 3, and 4.

Referring now to FIG. 6, an embodiment of a computing device chassis 600 is illustrated that may utilize the floating device location identification system of the present disclosure. In the illustrated embodiment, the computing device chassis 600 includes a plurality of side walls 600a, 600b, 600c, and 600d. A chassis housing 602 is defined by the chassis 600 between the side walls 600a-600d, and may house any of the components of a computing device, only some of which are illustrated and discussed below. In the illustrated example, the chassis housing 602 includes a floating device housing 602a that is located adjacent the side wall 600a, a floating device housing 602b that is located adjacent the side wall 600b, a floating device housing 602c that is located adjacent the side wall 600c, and a floating device housing 602d that is located adjacent the side wall 600d. As such, while not illustrated in FIG. 6, one of skill in the art in possession of the present disclosure will appreciate that the chassis 600 may include any of a variety of floating device mounting and/or coupling features adjacent each of the floating device housings 602a-602d.

Furthermore, the chassis 600 may include respective chassis location identification features adjacent each floating device housing in the chassis 600. For example, FIG. 6 illustrates a chassis location identification feature 604 that is located adjacent the floating device housing 602a and that includes four chassis location identification elements 604a, 604b, 604c, and 604d that, as described below, provide 4/4 floating device/chassis contact points for device location identification. FIG. 6 also illustrates a chassis location identification feature 606 that is adjacent the floating device housing 602b and that includes three chassis location identification elements 606a, 606b, and 604c that, as described below, provide 3/4 floating device/chassis contact points in a 2, 3, 4 configuration for device location identification. FIG. 6 also illustrates a chassis location identification feature 608 that is located adjacent the floating device housing 602c and that includes two chassis location identification elements 608a and 608b that, as described below, provide 2/4 floating device/chassis contact points in a 2, 4 configuration for device location identification. FIG. 6 also illustrates a chassis location identification feature 610 that is located adjacent the floating device housing 602d and that includes three chassis location identification elements 610a, 610b, and 610c that, as described below, provide 3/4 floating device/chassis contact points in a 1, 3, 4 configuration for device location identification.

As illustrated, the chassis location identification elements included in the chassis location identification features 604-610 are provided by protrusions that extend from the side walls 600a-600d and into the chassis housing 602, and that are configured to engage at least some of the chassis engagement elements included on a floating device positioned in their adjacent floating device housing 602a-d. As will be appreciated by one of skill in the art in possession of the present disclosure, the protrusions that provide the chassis location identification elements may be extruded from the side walls 600a-600d on the chassis 600, provided by elements (e.g., screws, spring loaded pogo pins, etc.) connected to the side walls 600a-600d on the chassis 600, and/or provided in any of a verity of other manners that would be apparent to one of skill in the art in possession of the present disclosure. Furthermore, while the chassis location identification elements are illustrated as being provided by protrusions that extend from the side walls 600a-600d and into the chassis housing 602, one of skill in the art in possession of the present disclosure will recognize that the functionality provided by the chassis location identification elements may be provided in other manners that will fall within the scope of the present disclosure as well.

In the illustrated embodiment, a circuit board 612 is housed in the chassis 600 and may be provided by a motherboard and/or other circuit boards that would be apparent to one of skill in the art in possession of the present disclosure. A remote access controller subsystem 614 may be mounted to the circuit board 612 and, in a specific example, may be provided by an integrated Remote Access Controller (iDRAC®) available from DELL® Inc. of Round Rock, Tex., United States. A plurality of connectors are mounted to the circuit board 612 and, in the illustrated embodiment, include connector(s) 616a that are connected (e.g., via trace(s) in the circuit board 612) to the remote access controller subsystem 614, connector(s) 616b that are connected (e.g., via trace(s) in the circuit board 612) to the remote access controller subsystem 614, connector(s) 616c that are connected (e.g., via trace(s) in the circuit board 612) to the remote access controller subsystem 614, and connector(s) 616d that are connected (e.g., via trace(s) in the circuit board 612) to the remote access controller subsystem 614. Furthermore, while the examples provided below illustrate and describe the connectors 616a-616d positioned adjacent the floating devices to which they are connected for clarity of illustration, one of skill in the art in possession of the present disclosure will appreciate that the connectors 616a-616d may be positioned anywhere in the chassis 600 for connection to floating devices positioned anywhere in the chassis 600 while remaining within the scope of the present disclosure as well. As such, while a specific computing device chassis 600 has been illustrated, one of skill in the art in possession of the present disclosure will recognize that chassis provided according to the teachings of the present disclosure may include a variety of components and/or component configurations while remaining within the scope of the present disclosure as well.

Figure 7:
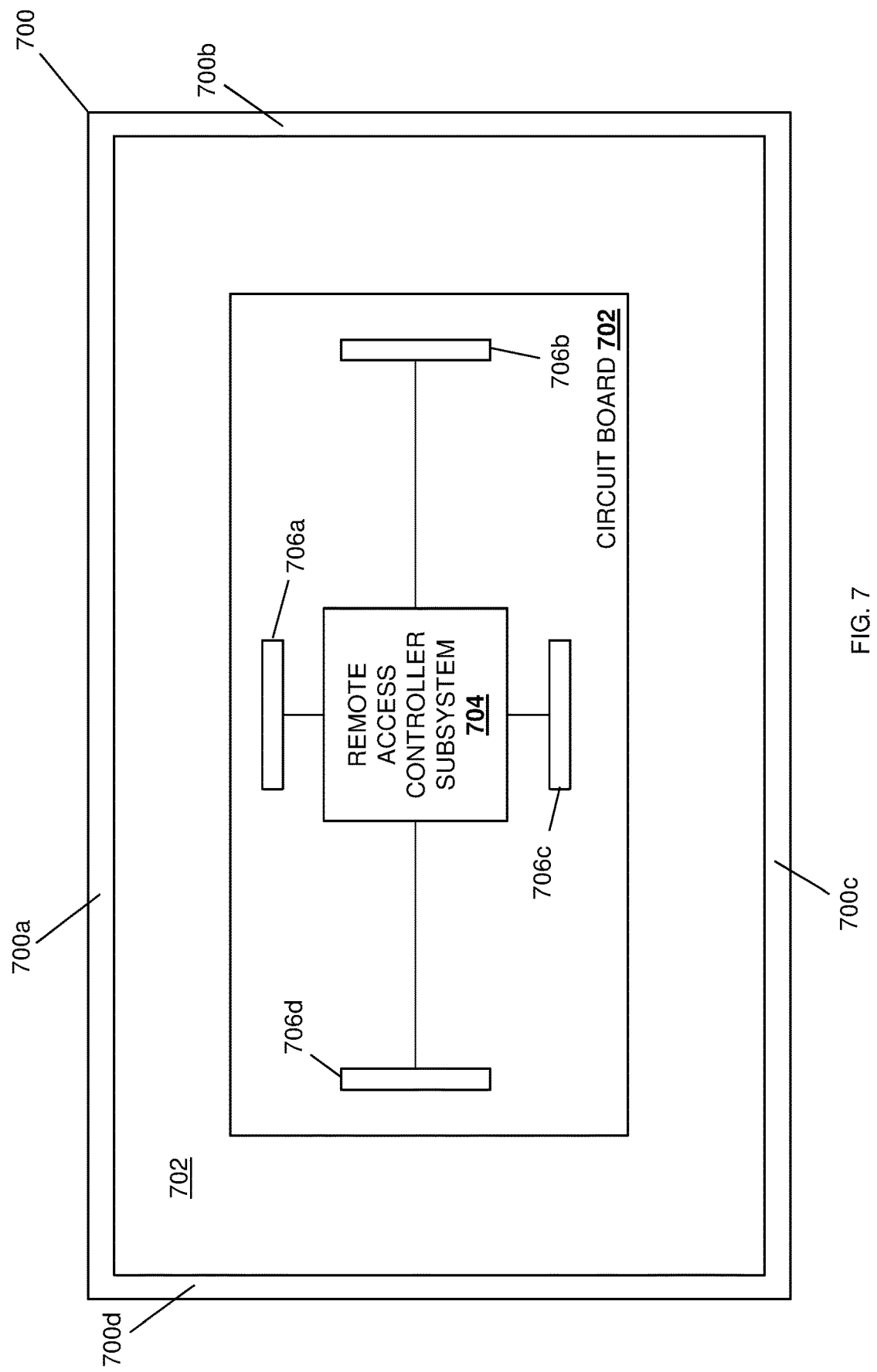
FIG. 7 is a schematic view illustrating an embodiment of a chassis that may house the floating device of FIG. 5.

Referring now to FIG. 7, an embodiment of a computing device chassis 700 is illustrated that may utilize the floating device location identification system of the present disclosure. In the illustrated embodiment, the computing device chassis 700 includes a plurality of side walls 700a, 700b, 700c, and 700d. A chassis housing 702 is defined by the chassis 700 between the side walls 700a-700d, and may house any of the components of a computing device, only some of which are illustrated and discussed below. As discussed below, the chassis housing 702 may be configured to house floating devices at any of a plurality locations within the chassis housing, and one of skill in the art in possession of the present disclosure will appreciate that the chassis 700 may include any of a variety of floating device mounting and/or coupling features adjacent each of those locations in the chassis housing 702 (referred to as floating device housings below).

In the illustrated embodiment, a circuit board 702 is housed in the chassis 700 and may be provided by a motherboard and/or other circuit boards that would be apparent to one of skill in the art in possession of the present disclosure. A remote access controller subsystem 704 is mounted to the circuit board 702 and, in a specific example, may be provided by an integrated Remote Access Controller (iDRAC®) available from DELL® Inc. of Round Rock, Tex., United States. A plurality of connectors are mounted to the circuit board 702 and, in the illustrated embodiment, include connector(s) 706a that are connected (e.g., via trace(s) in the circuit board 702) to the remote access controller subsystem 704, connector(s) 706b that are connected (e.g., via trace(s) in the circuit board 702) to the remote access controller subsystem 704, connector(s) 706c that are connected (e.g., via trace(s) in the circuit board 702) to the remote access controller subsystem 704, and connector(s) 706d that are connected (e.g., via trace(s) in the circuit board 702) to the remote access controller subsystem 704. Furthermore, while the examples provided below illustrated and describe the connectors 706a-706d positioned adjacent the floating devices to which they are connected for clarity of illustration, one of skill in the art in possession of the present disclosure will appreciate that the connectors 706a-706d may be positioned anywhere in the chassis 700 for connection to floating devices positioned anywhere in the chassis 700 while remaining within the scope of the present disclosure as well. As such, while a specific computing device chassis 700 has been illustrated, one of skill in the art in possession of the present disclosure will recognize that chassis provided according to the teachings of the present disclosure may include a variety of components and/or component configurations while remaining within the scope of the present disclosure as well.

Figure 8:
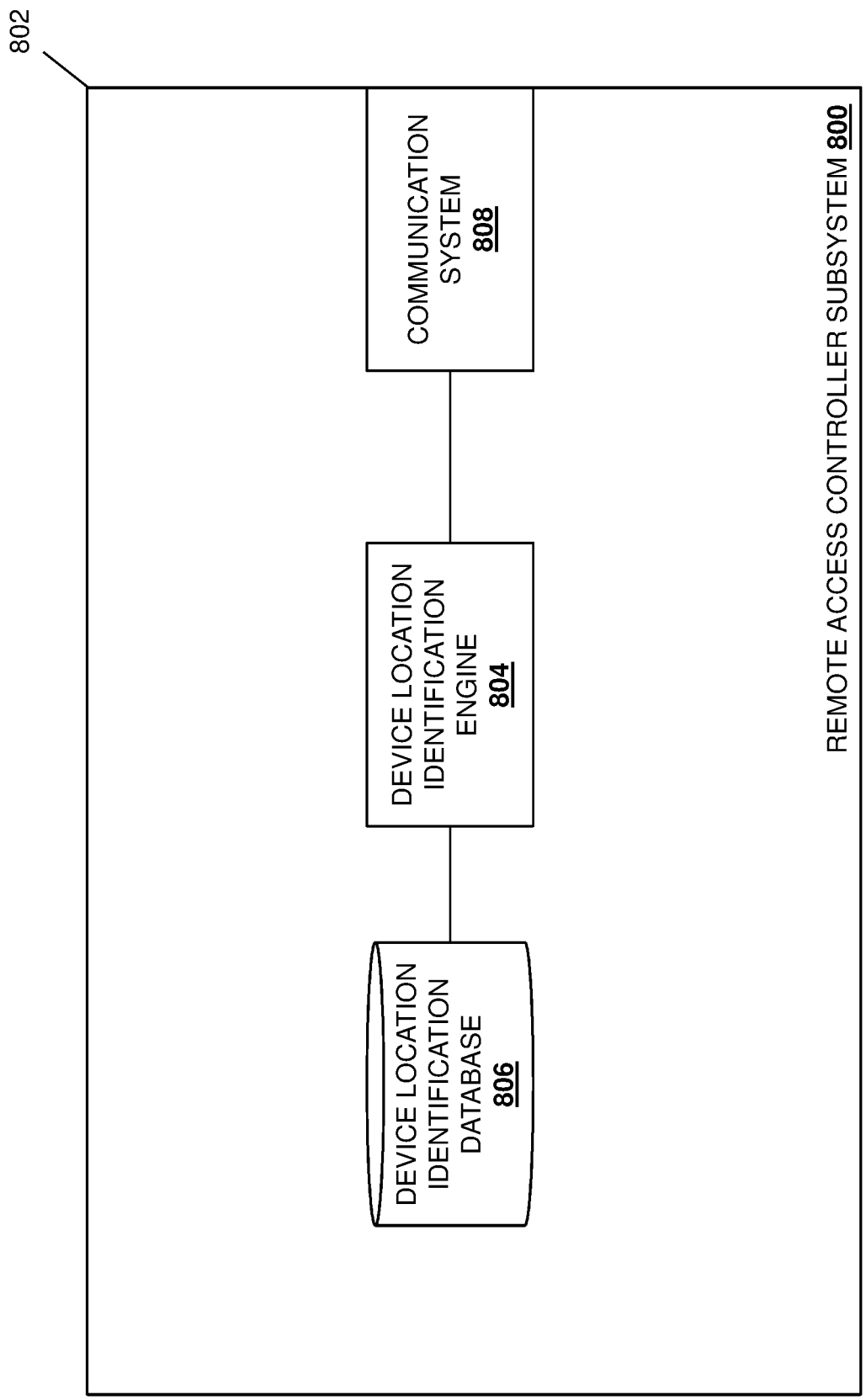
FIG. 8 is a schematic view illustrating an embodiment of a remote access controller that may be included in the chassis of FIGS. 6 and 7.

Referring now to FIG. 8, an embodiment of a remote access controller subsystem 800 is illustrated that may provide the remote access controller subsystems 614 and/or 704 discussed above with reference to FIGS. 6 and 7. As such, the remote access controller subsystem 800 may be provided by the iDRAC® available from DELL® Inc. of Round Rock, Tex., United States. However, while illustrated and discussed as a remote access controller subsystem, one of skill in the art in possession of the present disclosure will recognize that the functionality of the remote access controller subsystem 800 discussed below may be provided by other device location identification subsystems that are configured to operate similarly as the remote access controller subsystems discussed below. In the illustrated embodiment, the remote access controller subsystem 800 includes a chassis 802 that houses the components of the remote access controller subsystem 800, only some of which are illustrated below. For example, the chassis 802 may be part of the circuit board 612 and/or 702 discussed above with reference to FIGS. 6 and 7, a circuit board that is coupled to the circuit board 612 and/or 702 discussed above with reference to FIGS. 6 and 7, and/or a chassis that is external to the chassis 600 or 700 discussed above with reference to FIGS. 6 and 7.

In an example, the chassis 802 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a device location identification engine 804 that is configured to perform the functionality of the device location identification engines and/or remote access controller subsystems discussed below. The chassis 802 may also house a storage system (not illustrated, but which may include the storage 108 discussed above with reference to FIG. 1) that is coupled to the device location identification engine 804 (e.g., via a coupling between the storage system and the processing system) and that includes a device location identification database 806 that is configured to store any of the information utilized by the device location identification engine 804 discussed below.

The chassis 802 may also house a communication system 808 that is coupled to the device location identification engine 804 (e.g., via a coupling between the communication system 308 and the processing system) and that may be provided by a Network Interface Controller (NIC), wireless communication systems (e.g., BLUETOOTH®, Near Field Communication (NFC) components, WiFi components, etc.), and/or any other communication components that would be apparent to one of skill in the art in possession of the present disclosure. However, while a specific remote access controller subsystem 800 has been illustrated and described, one of skill in the art in possession of the present disclosure will recognize that device location identification subsystems (or other devices operating according to the teachings of the present disclosure in a manner similar to that described below for the remote access controller subsystem 800) may include a variety of components and/or component configurations for providing conventional remote access controller subsystem functionality, as well as the functionality discussed below, while remaining within the scope of the present disclosure as well.

Figure 9:
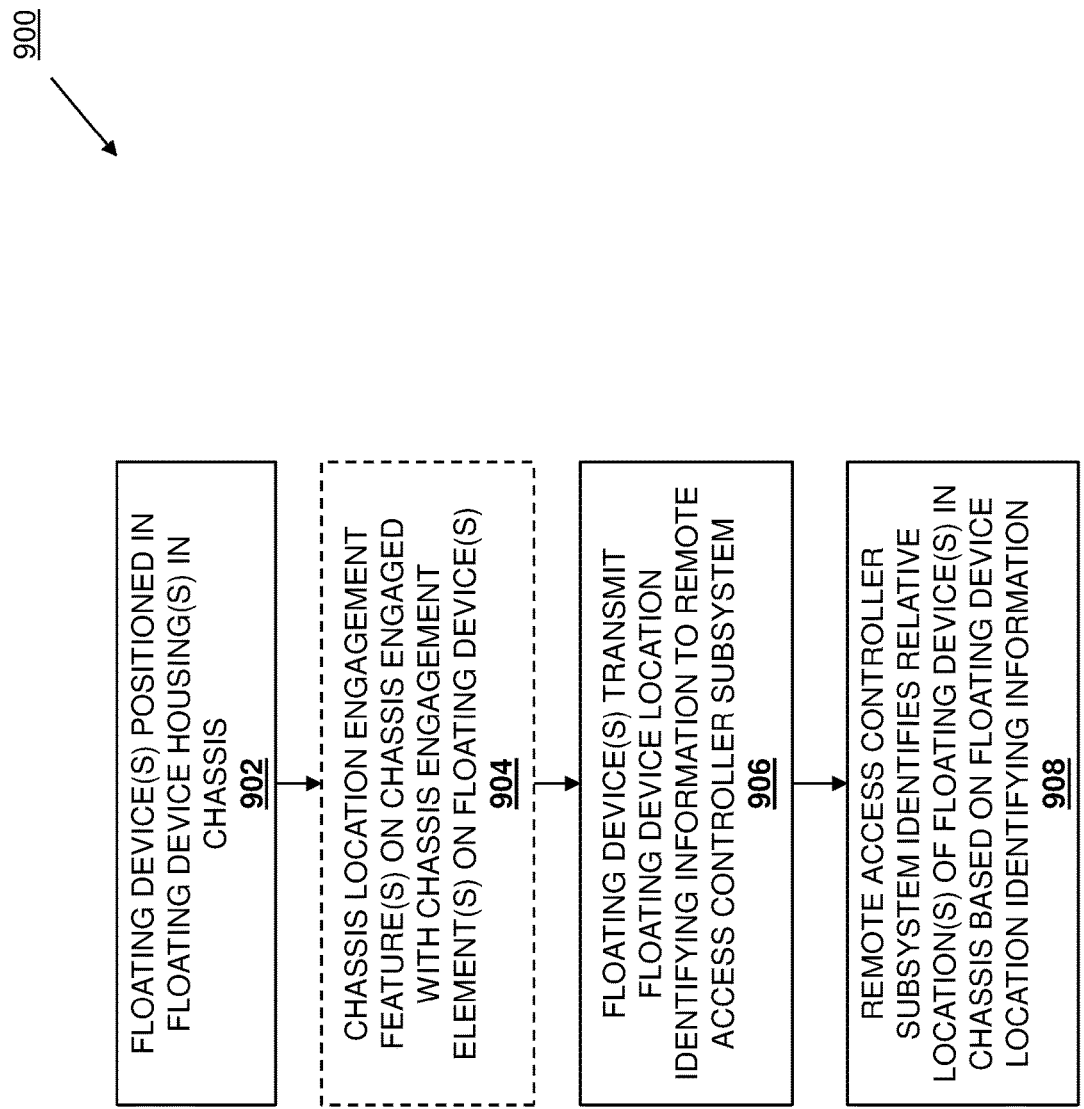
FIG. 9 is a flow chart illustrating an embodiment of a method for identifying the location of a floating device.

Referring now to FIG. 9, an embodiment of a method 900 for identifying the location of a floating device is illustrated. As discussed below, the systems and methods of the present disclosure provide for the identification of the relative location of a floating device within a chassis via the transmission by that floating device of floating device location identifying information that may be based on, for example, a portion of the chassis engaged by that floating device. For example, the floating device location identification system of the present disclosure includes a chassis that defines a plurality of floating device housings, and that includes a respective chassis location identification feature that is located adjacent each floating device housing and that is configured to identify the relative location of that floating device housing in the chassis. A floating device may be positioned in a first floating device housing defined by the chassis and adjacent a first chassis location identification feature that is included in the chassis adjacent that first floating device housing. The floating device includes at least one floating device cabling connector that is connected via a cabling subsystem to a device location identification subsystem, and a plurality of chassis engagement elements that are coupled to the at least one floating device cabling connector and that engage the first chassis location identification feature. The floating device transmits floating device location identifying information to the device location identification subsystem that is based on the engagement of the plurality of chassis engagement elements and the first chassis location identification feature and that identifies a relative location of the floating device in the chassis. As such, floating devices that may be positioned in a variety of different locations within a chassis may have their location identified, thus allowing the configuration of those floating devices based on their identified location.

The method 900 begins at block 902 where floating device(s) are positioned in floating device housing(s) in a chassis. In an embodiment, at block 902, floating devices may be positioning in floating device housings included in the chassis housing defined by a chassis. For example, with reference to FIG. 10A, a floating device 1000 (which may be provided by the floating devices 200, 300, and/or 400 discussed above) may be coupled to the connector(s) 616*a* on the circuit board 612 via cabling subsystems 1000*a* that engage the connectors 204, 206, and 208, and positioned in the floating device housing 602*a*. Similarly, a floating device 1002 (which may be provided by the floating devices 200, 300, and/or 400 discussed above) may be coupled to the connector(s) 616*b* on the circuit board 612 via cabling subsystems 1002*a* that engage the connectors 204, 206, and/or 208, and positioned in the floating device housing 602*b*. Similarly as well, a floating device 1004 (which may be provided by the floating devices 200, 300, and/or 400 discussed above) may be coupled to the connector(s) 616*c* on the circuit board 612 via cabling subsystems 1004*a* that engage the connectors 204, 206, and/or 208, and positioned in the floating device housing 602*c*. Similarly as well, a floating device 1006 (which may be provided by the floating devices 200, 300, and/or 400 discussed above) may be coupled to the connector(s) 616*d* on the circuit board 612 via cabling subsystems 1006*a* that engage the connectors 204, 206, and/or 208, and positioned in the floating device housing 602*d*.

Figure 11A:
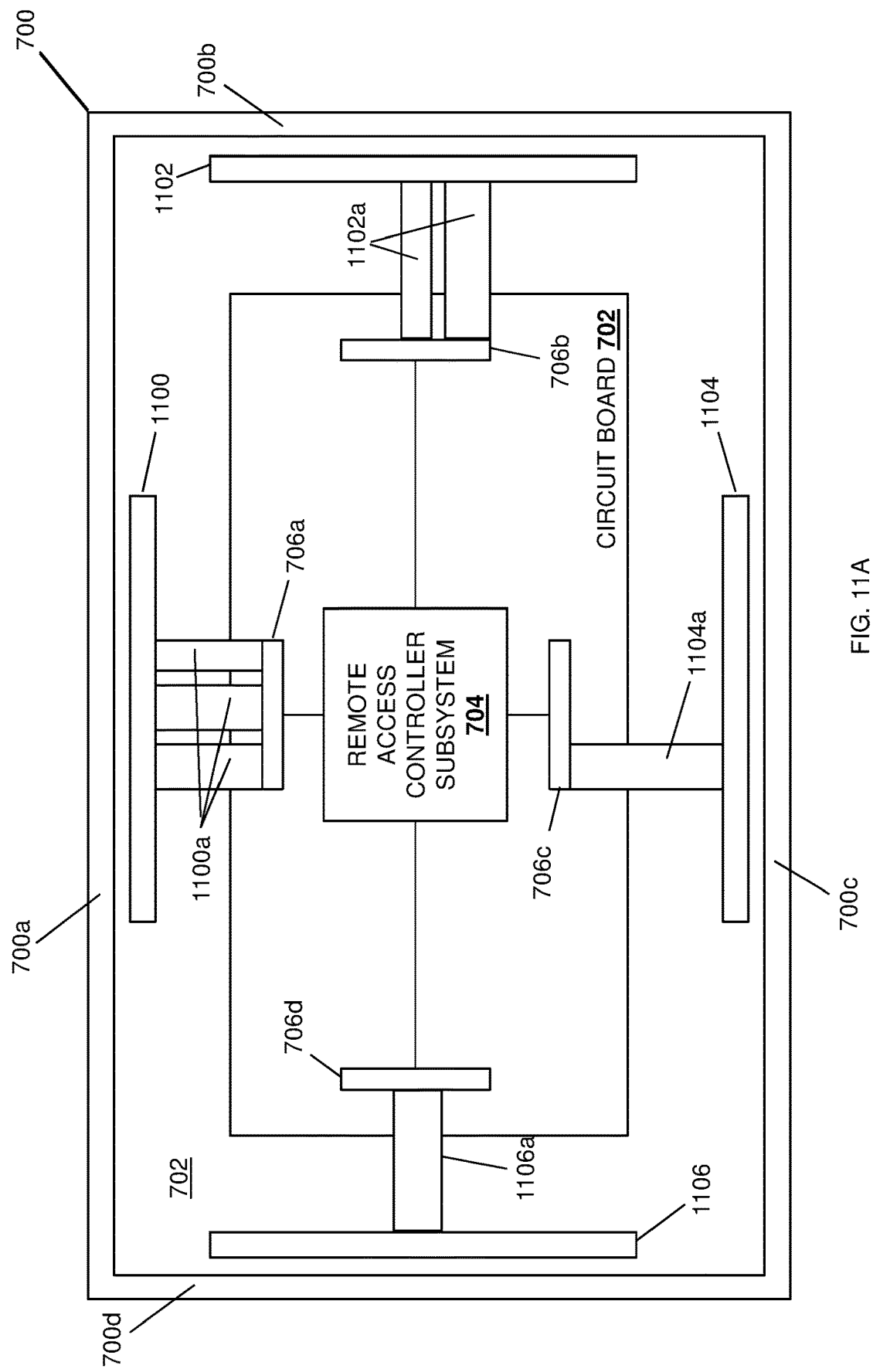
FIG. 11A is a schematic view illustrating an embodiment of a plurality of the floating devices of FIG. 5 located in the chassis of FIG. 7.

In another example, with reference to FIG. 11A, a floating device 1100 (which may be provided by the floating device 500 discussed above) may be coupled to the connector(s) 706*a* on the circuit board 702 via cabling subsystems 1100*a* that engage the connectors 204, 206, and 208, and positioned in a floating device housing included in the chassis housing 702. Similarly, a floating device 1102 (which may be provided by the floating device 500 discussed above) may be coupled to the connector(s) 706*b* on the circuit board 702 via cabling subsystems 1102*a* that engage the connectors 204, 206, and 208, and positioned in a floating device housing included in the chassis housing 702. Similarly as well, a floating device 1104 (which may be provided by the floating device 500 discussed above) may be coupled to the connector(s) 706*c* on the circuit board 702 via cabling subsystems 1104*a* that engage the connectors 204, 206, and 208, and positioned in a floating device housing included in the chassis housing 702. Similarly as well, a floating device 1106 (which may be provided by the floating device 500 discussed above) may be coupled to the connector(s) 706*d* on the circuit board 702 via cabling subsystems 1106*a* that engage the connectors 204, 206, and/or 208, and positioned in a floating device housing included in the chassis housing 702.

The method 900 then proceeds to optional block 904 where chassis location engagement feature(s) on the chassis are engaged with chassis engagement element(s) on the floating device(s). In an embodiment, at optional block 904, the floating device(s) positioned in the floating device housings included in the chassis housing defined by the chassis will engage chassis location engagement features on the chassis. For example, the positioning of the floating device 1000 in the floating device housing 602*a* at block 902 will result in the engagement of the floating device 1000 with the chassis location identification feature 604 on the side wall 600*a* of the chassis 600. As discussed above, the chassis location identification feature 604 includes four chassis location identification elements 604*a*, 604*b*, 604*c*, and 604*d* and, as illustrated in FIG. 10B, each of the chassis location identification elements 604*a*, 604*b*, 604*c*, and 604*d* will engage corresponding chassis engagement elements 212*a*, 212*b*, 212*c*, and 212*d* on the floating device 1000 to provide 4/4 floating device/chassis contact points (as illustrated by the blackened chassis engagement elements 212*a*, 212*b*, 212*c*, and 212*d*) between the floating device 1000 and the chassis location identification feature 604.

Similarly, the positioning of the floating device 1002 in the floating device housing 602*b* at block 902 will result in the engagement of the floating device 1002 with the chassis location identification feature 606 on the side wall 600*b* of the chassis 600. As discussed above, the chassis location identification feature 606 includes three chassis location identification elements 606*a*, 606*b*, and 606*c*, and, as illustrated in FIG. 10O, each of the chassis location identification elements 606*a*, 606*b*, and 606*c* will engage corresponding chassis engagement elements 212*a*, 212*b*, and 212*c* on the floating device 1002 to provide 3/4 floating device/chassis contact points in a 2, 3, 4 configuration (as illustrated by the blackened chassis engagement elements 212*a*, 212*b*, and 212*c*) between the floating device 1002 with the chassis location identification feature 606.

Similarly, the positioning of the floating device 1004 in the floating device housing 602*c* at block 902 will result in the engagement of the floating device 1004 with the chassis location identification feature 608 on the side wall 600*c* of the chassis 600. As discussed above, the chassis location identification feature 608 includes two chassis location identification elements 608*a* and 608*b*, and, as illustrated in FIG. 10D, each of the chassis location identification elements 608*a* and 608*b* will engage corresponding chassis engagement elements 212*b* and 212*d* on the floating device 1004 to provide 2/4 floating device/chassis contact points in a 2, 4 configuration (as illustrated by the blackened chassis engagement elements 212*b* and 212*d*) between the floating device 1004 with the chassis location identification feature 608.

Figure 10A:
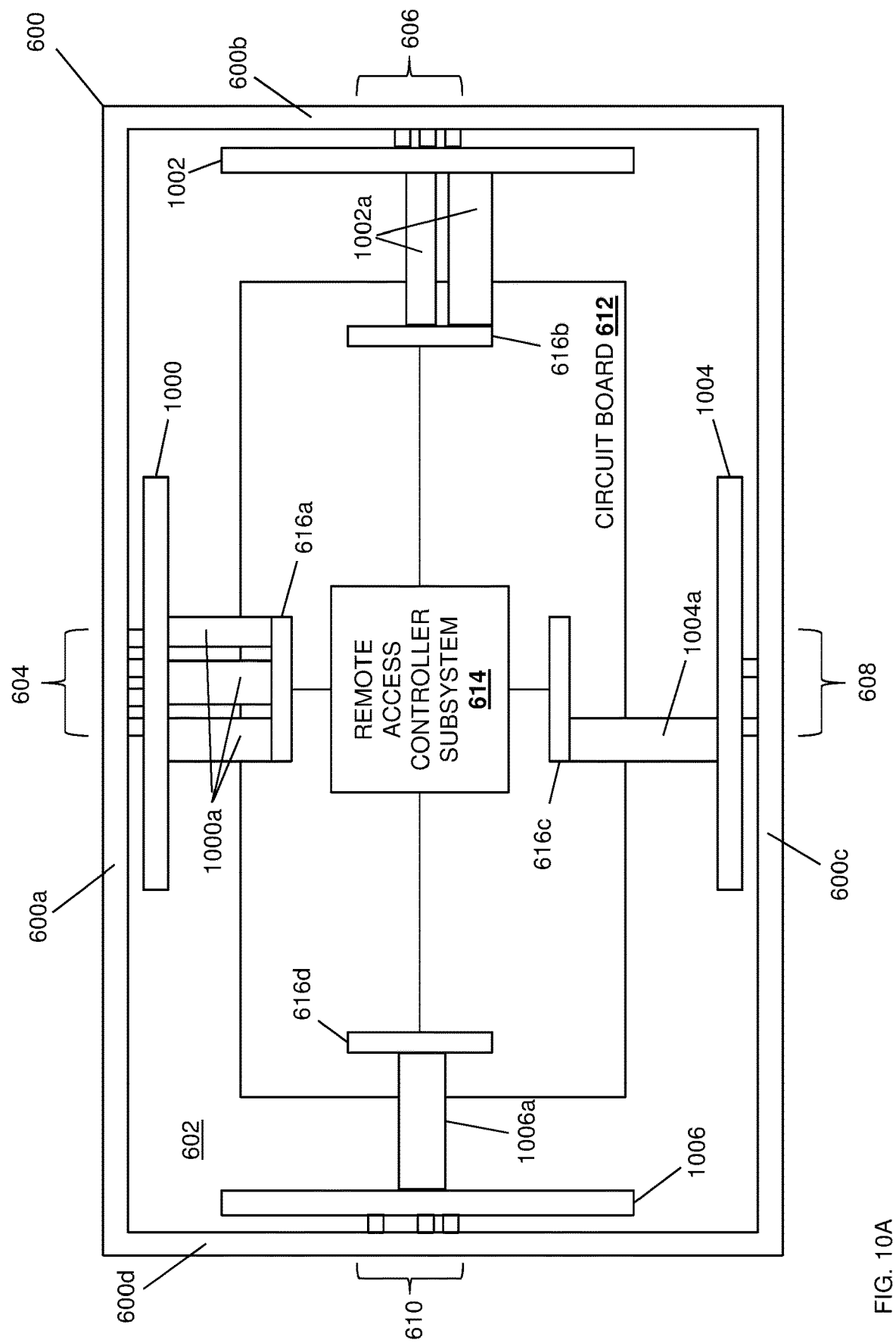
FIG. 10A is a schematic view illustrating an embodiment of a plurality of the floating devices of FIGS. 2A and 2B located in the chassis of FIG. 6.
Figure 10C:
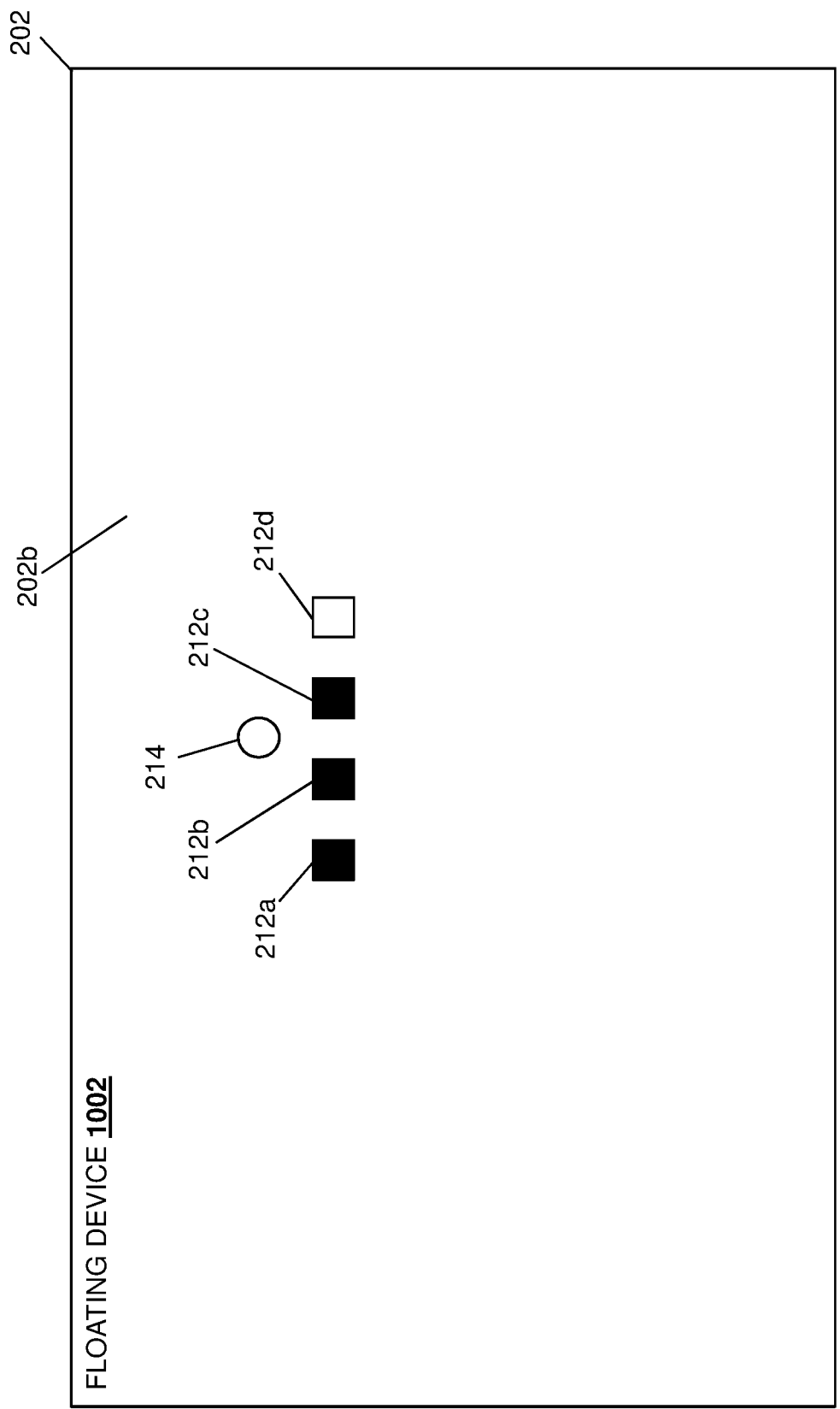
FIG. 10C is a schematic view illustrating an embodiment of one of the floating devices located in the chassis in FIG. 10A.
Figure 10E:
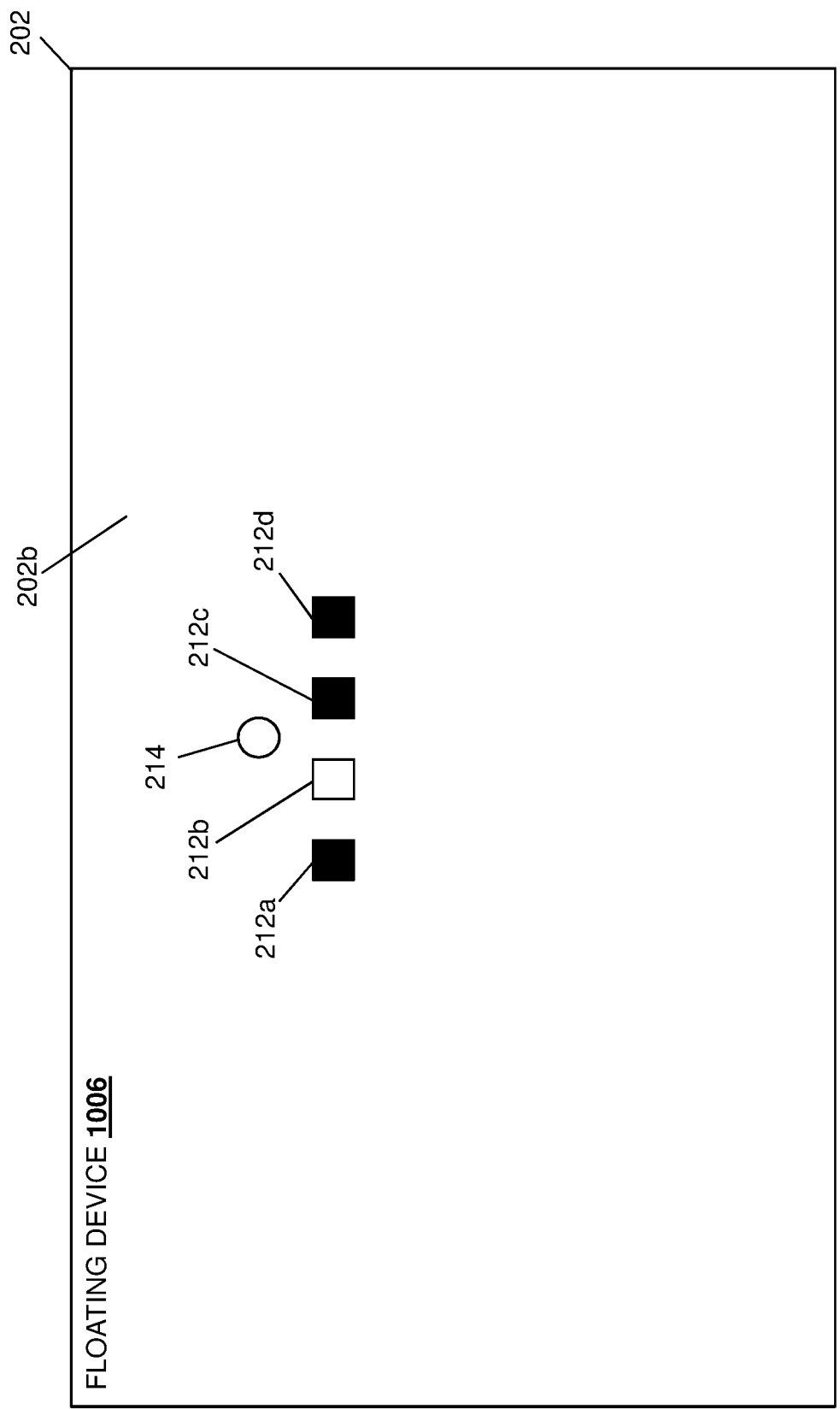
FIG. 10E is a schematic view illustrating an embodiment of one of the floating devices located in the chassis in FIG. 10A.

Similarly, the positioning of the floating device 1006 in the floating device housing 602*d* at block 902 will result in the engagement of the floating device 1006 with the chassis location identification feature 610 on the side wall 600*d* of the chassis 600. As discussed above, the chassis location identification feature 610 includes three chassis location identification elements 610*a*, 610*b*, and 610*d*, and, as illustrated in FIG. 10E, each of the chassis location identification elements 610*a*, 610*b*, and 610*d* will engage corresponding chassis engagement elements 212*a*, 212*c*, and 212*d* on the floating device 1006 to provide 3/4 floating device/chassis contact points in a 1, 3, 4 configuration (as illustrated by the blackened chassis engagement elements 212a, 212c, and 212d) between the floating device 1006 with the chassis location identification feature 610.

The method 900 then proceeds to block 906 where floating device(s) transmit floating device location identifying information to a remote access controller subsystem. In an embodiment, at block 906, each floating device positioned in a floating device housing the chassis will transmit floating device location identification information to the remote access controller subsystem in the chassis. For example, with reference to the embodiment of the floating device 300 discussed above with reference to FIG. 3, at block 906 any of the floating devices 1000, 1002, 1004, and 1006 discussed above with reference to FIGS. 10A-10E may transmit floating device location identification information that identifies which of its chassis engagement elements 212a-212d are engaged with its adjacent chassis location identification feature 604, 606, 608, and 610, respectively, on the chassis 600. For example, with reference to the floating device 1000 discussed above with reference to FIGS. 10A and 10B, the floating device 1000 may transmit floating device location identification information that identifies its chassis engagement elements 212a, 212b, 212c, and 212d that are engaged with the chassis location identification elements 604a, 604b, 604c, and 604d, respectively, on the chassis location identification feature 604 via the traces 302, 304, 306, and 308 and to the connectors 204, 206, and 208.

Similarly, with reference to the floating device 1002 discussed above with reference to FIGS. 10A and 100, the floating device 1002 may transmit floating device location identification information that identifies its chassis engagement elements 212a, 212b, and 212c that are engaged with the chassis location identification elements 606a, 606b, and 606c, respectively, on the chassis location identification feature 606 via the traces 302, 304, and 306, and to the connectors 204, 206, and/or 208. Similarly as well, with reference to the floating device 1004 discussed above with reference to FIGS. 10A and 10D, the floating device 1004 may transmit floating device location identification information that identifies its chassis engagement elements 212b and 212d that are engaged with the chassis location identification elements 608a and 608b, respectively, on the chassis location identification feature 608 via the traces 304 and 308, and to the connectors 204, 206, and/or 208. Similarly as well, with reference to the floating device 1006 discussed above with reference to FIGS. 10A and 10E, the floating device 1006 may transmit floating device location identification information that identifies its chassis engagement elements 212a, 212c, and 212d that are engaged with the chassis location identification elements 610a, 610b, and 610c, respectively, on the chassis location identification feature 610 via the traces 302, 306, and 308, and to the connectors 204, 206, and/or 208.

In another example, with reference to the embodiment of the floating device 400 discussed above with reference to FIG. 4, at block 906 any of the floating devices 1000, 1002, 1004, and 1006 discussed above with reference to FIGS. 10A-10E may determine floating device location identification information that identifies the floating device housing in which it is located based on which of its chassis engagement elements 212a-212d are engaged with its adjacent chassis location identification feature 604, 606, 608, and 610, respectively, on the chassis 600, and then transit that floating device location identification information to the remote access controller subsystem 614. In some embodiments, during or prior to the method 900, each of the floating devices 1000-1006/400 may store floating device housing/chassis location identification feature associations in its database 406. For example, the floating device housing 602a may be associated with the chassis location identification feature 604 in the database 406, the floating device housing 602b may be associated with the chassis location identification feature 606 in the database 406, the floating device housing 602c may be associated with the chassis location identification feature 608 in the database 406, and the floating device housing 602d may be associated with the chassis location identification feature 610 in the database 406. As will be appreciated by one of skill in the art in possession of the present disclosure, the floating device housing/chassis location identification feature associations may be provided in the databases 406 of the floating devices 1000-1006/400 by a user, automatically in response to connecting the floating devices 1000-1006/400 to the circuit board 612 at block 902, and/or in any other manner known in the art.

As such, with reference to the floating device 1000 discussed above with reference to FIGS. 10A and 10B, the controller 404 may identify (via the resistor network 402) that its chassis engagement elements 212a, 212b, 212c, and 212d are engaged with the chassis location identification elements 604a, 604b, 604c, and 604d, respectively, on the chassis location identification feature 604. In response, the controller 404 may access its database 406 and determine that the chassis location identification feature 604 (e.g., a chassis location identification feature that provides 4/4 floating device/chassis contact points with the floating device that engages it) is associated with the floating device housing 602a. In response, the controller 404 may generate floating device location identifying information that identifies that the floating device 1000 is located in the floating device housing 602a, and transmit that floating device location identifying information via the connector 204 to the remote access controller subsystem 614.

Similarly, with reference to the floating device 1002 discussed above with reference to FIGS. 10A and 100, the controller 404 may identify (via the resistor network 402) that its chassis engagement elements 212a, 212b, and 212c are engaged with the chassis location identification elements 606a, 606b, and 606c, respectively, on the chassis location identification feature 606. In response, the controller 404 may access its database 406 and determine that the chassis location identification feature 606 (e.g., a chassis location identification feature that provides 3/4 floating device/chassis contact points in a 2, 3, 4 configuration with the floating device that engages it) is associated with the floating device housing 602b. In response, the controller 404 may generate floating device location identifying information that identifies that the floating device 1002 is located in the floating device housing 602b, and transmit that floating device location identifying information via the connector 204 to the remote access controller subsystem 614.

Similarly as well, with reference to the floating device 1004 discussed above with reference to FIGS. 10A and 10D, the controller 404 may identify (via the resistor network 402) that its chassis engagement elements 212b and 212d are engaged with the chassis location identification elements 608a and 608b, respectively, on the chassis location identification feature 608. In response, the controller 404 may access its database 406 and determine that the chassis location identification feature 608 (e.g., a chassis location identification feature that provides 2/4 floating device/chassis contact points in a 2, 4 configuration with the floating device that engages it) is associated with the floating device housing 602c. In response, the controller 404 may generate floating device location identifying information that identifies that the floating device 1004 is located in the floating device housing 602c, and transmit that floating device location identifying information via the connector 204 to the remote access controller subsystem 614.

Similarly as well, with reference to the floating device 1006 discussed above with reference to FIGS. 10A and 10E, the controller 404 may identify (via the resistor network 402) that its chassis engagement elements 212a, 212c, and 212d are engaged with the chassis location identification elements 610a, 610b, and 610c, respectively, on the chassis location identification feature 610. In response, the controller 404 may access its database 406 and determine that the chassis location identification feature 610 (e.g., a chassis location identification feature that provides 3/4 floating device/chassis contact points in a 1, 3, 4 configuration with the floating device that engages it) is associated with the floating device housing 602d. In response, the controller 404 may generate floating device location identifying information that identifies that the floating device 1006 is located in the floating device housing 602d, and transmit that floating device location identifying information via the connector 204 to the remote access controller subsystem 614.

In another example, with reference to the embodiment of the floating device 500 discussed above with reference to FIG. 5, at block 906 any of the floating devices 1000, 1002, 1004, and 1006 discussed above with reference to FIGS. 10A-10E may transmit floating device location identification information that identifies the floating device housing in which it is located. In some embodiments, prior to the method 900, the remote access controller subsystem 800/704 may store floating device housing/wireless signal characteristic associations in its device location identification database 806. For example, during manufacture of the computing device that utilizes the chassis 700, a computing device manufacturer may position the floating device 500 in different floating device housings included in the chassis housing 702 defined by the chassis 700, use the wireless communication device 514 in that floating device 500 to transmit wireless device location identifying information signals, and measure the wireless signals characteristics (e.g., transmission angle, transmission strength, and/or other wireless signal characteristics known in the art) of those wireless device location identifying information signals. As such, each floating device housing included in the chassis housing 702 defined by the chassis 700 may be associated with particular wireless signals characteristics of wireless device location identifying information signals transmitted by a floating device positioned in that floating device housing. As will be appreciated by one of skill in the art in possession of the present disclosure, the floating device housing/wireless signal characteristic associations may be provided in the device location identification database 806 of the remote access controller subsystem 800/704 by a user, and/or in any other manner known in the art.

Figure 11B:
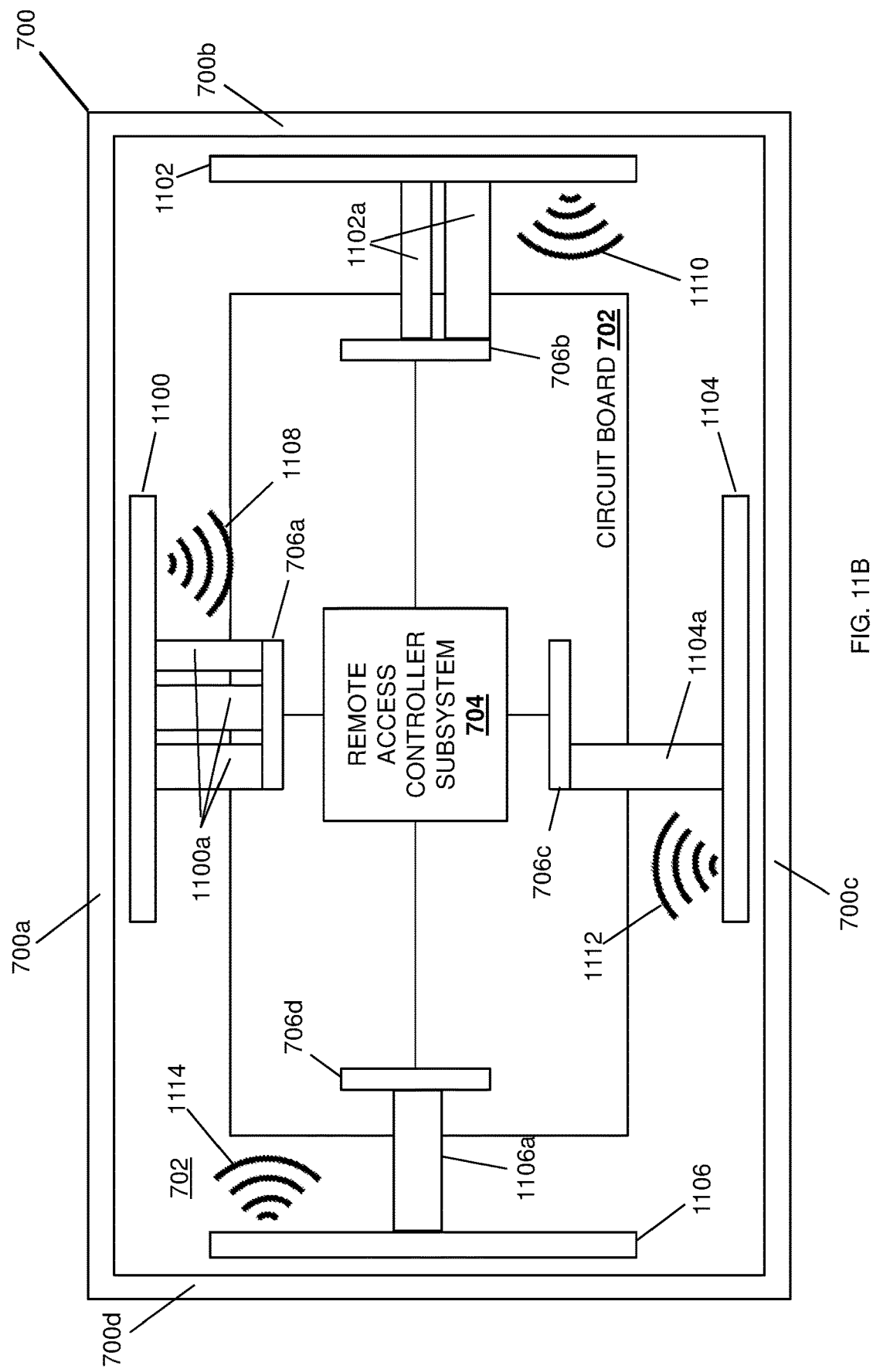
FIG. 11B is a schematic view illustrating an embodiment of a plurality of the floating devices of FIG. 5 located in the chassis of FIG. 7 and operating during the method of FIG. 9.

As such, at block 906 and as illustrated in FIG. 11B, the controller 512 in the floating device 500/1100 may utilize the wireless communication device 514 in order to transmit floating device location identification information to the remote access controller subsystem 704 that includes wireless device location identifying information signals 1108. Similarly, at block 906 and as illustrated in FIG. 11B, the controller 512 in the floating device 500/1100 may utilize the wireless communication device 514 in order to transmit floating device location identification information to the remote access controller subsystem 704 that includes wireless device location identifying information signals 1110. Similarly as well, at block 906 and as illustrated in FIG. 11B, the controller 512 in the floating device 500/1104 may utilize the wireless communication device 514 in order to transmit floating device location identification information to the remote access controller subsystem 704 that includes wireless device location identifying information signals 1112. Similarly as well, at block 906 and as illustrated in FIG. 11B, the controller 512 in the floating device 500/1106 may utilize the wireless communication device 514 in order to transmit floating device location identification information to the remote access controller subsystem 704 that includes wireless device location identifying information signals 1114. In some embodiments, the wireless device location identifying information signals 1108, 1110, 1112, and 1114 may include a variety of information such as, for example, the identity (e.g., a PCIe device identifier) of the floating device 1100, 1102, 1104, and 1006, respectively, that provided those wireless device location identifying information signal(s).

In an embodiment, the transmission of the wireless device location identifying information signals 1108, 1110, 1112, and 1114 may only be performed for a limited time period in order to ensure security for the computing device that utilizes the chassis 700. For example, the power-off circuit 516 may be configured, following some time period, to cut off power to the wireless communication device 514 and prevent further use of the wireless communication device 514. As such, in one specific example, the power-off circuit 516 may allow power from the power subsystem 518 and via a power rail dedicated to the wireless communication device 514 to be provided to the wireless communication device 514 following power-on, reset, and/or other initialization of the floating device 500, and may then cut off power from the power subsystem 518 to the wireless communication device 514 after some time period. As such, the wireless communication device 514 in each floating device 1100-1106/500 may only be able to transmit the wireless device location identifying information signals 1108, 1110, 1112, and 1114 for a limited time following its initialization, after which a reset of the floating device 1100-1106/500 is required to again transmit the wireless device location identifying information signals 1108, 1110, 1112, and 1114.

The method 900 then proceeds to block 908 where the remote access controller subsystem identifies relative location(s) of floating device(s) in the chassis based on the floating device location identifying information. In an embodiment, at block 908, the device location identification engine 804 in the remote access controller subsystem 800 may receive the floating device location identifying information via its communication system 808 and, in response, identify the relative locations of the floating devices that are positioned in its chassis.

With reference to the embodiment discussed above in which the floating devices 1000-1006/300 transmit floating device location identification information that identifies which of their chassis engagement elements 212a-212d are engaged with their adjacent chassis location identification feature 604, 606, 608, and 610, during or prior to the method 900, the remote access controller subsystem 614/800 may store floating device housing/chassis location identification feature associations in its device location identification database 806. Similarly as discussed above, the floating device housing 602a may be associated with the chassis location identification feature 604 in the device location identification database 806, the floating device housing 602b may be associated with the chassis location identification feature 606 in the device location identification database 806, the floating device housing 602*c* may be associated with the chassis location identification feature 608 in the device location identification database 806, and the floating device housing 602*d* may be associated with the chassis location identification feature 610 in the device location identification database 806. As will be appreciated by one of skill in the art in possession of the present disclosure, the floating device housing/chassis location identification feature associations may be provided in the device location identification database 806 by a user, and/or in any other manner known in the art.

As such, with reference to the floating device 1000 discussed above with reference to FIGS. 10A and 10B, the device location identification engine 804 may identify that the chassis engagement elements 212*a*, 212*b*, 212*c*, and 212*d* on the floating device 1000 are engaged with the chassis location identification elements 604*a*, 604*b*, 604*c*, and 604*d*, respectively, on the chassis location identification feature 604. In response, the device location identification engine 804 may access its device location identification database 806 and determine that the chassis location identification feature 604 (e.g., a chassis location identification feature that provides 4/4 floating device/chassis contact points with the floating device that engages it) is associated with the floating device housing 602*a*. Thus, at block 908, the device location identification engine 804 may determine that the floating device 1000 is located in the floating device housing 602*a*.

Similarly, with reference to the floating device 1002 discussed above with reference to FIGS. 10A and 10C, the device location identification engine 804 may identify that the chassis engagement elements 212*a*, 212*b*, and 212*c* on the floating device 1002 are engaged with the chassis location identification elements 606*a*, 606*b*, and 606*c*, respectively, on the chassis location identification feature 606. In response, the device location identification engine 804 may access its device location identification database 806 and determine that the chassis location identification feature 606 (e.g., a chassis location identification feature that provides 3/4 floating device/chassis contact points in a 2, 3, 4 configuration with the floating device that engages it) is associated with the floating device housing 602*b*. Thus, at block 908, the device location identification engine 804 may determine that the floating device 1002 is located in the floating device housing 602*b*.

Similarly as well, with reference to the floating device 1004 discussed above with reference to FIGS. 10A and 10D, the device location identification engine 804 may identify that the chassis engagement elements 212*b* and 212*d* on the floating device 1004 are engaged with the chassis location identification elements 608*a* and 608*b*, respectively, on the chassis location identification feature 608. In response, the device location identification engine 804 may access its device location identification database 806 and determine that the chassis location identification feature 608 (e.g., a chassis location identification feature that provides 2/4 floating device/chassis contact points in a 2, 4 configuration with the floating device that engages it) is associated with the floating device housing 602*c*. Thus, at block 908, the device location identification engine 804 may determine that the floating device 1004 is located in the floating device housing 602*c*.

Similarly as well, with reference to the floating device 1006 discussed above with reference to FIGS. 10A and 10E, the device location identification engine 804 may identify that the chassis engagement elements 212*a*, 212*c*, and 212*d* on the floating device 1006 are engaged with the chassis location identification elements 610*a*, 610*b*, and 610*c*, respectively, on the chassis location identification feature 610. In response, the device location identification engine 804 may access its device location identification database 806 and determine that the chassis location identification feature 610 (e.g., a chassis location identification feature that provides 3/4 floating device/chassis contact points in a 1, 3, 4 configuration with the floating device that engages it) is associated with the floating device housing 602*d*. Thus, at block 908, the device location identification engine 804 may determine that the floating device 1006 is located in the floating device housing 602*d*.

With reference to the embodiment discussed above in which the floating devices 1000-1006/400 transmit floating device location identification information that identifies the floating device housing in which it is located, at block 908 the remote access controller subsystem 614/800 may receive that floating device location identification information via its communication system 808. As such, at block 908, the device location identification engine 804 may receive the floating device location identification information from the floating device 1000 that identifies that the floating device 1000 is located in the floating device housing 602*a*. Similarly, at block 908, the device location identification engine 804 may receive the floating device location identification information from the floating device 1002 that identifies that the floating device 1002 is located in the floating device housing 602*b*. Similarly as well, at block 908, the device location identification engine 804 may receive the floating device location identification information from the floating device 1004 that identifies that the floating device 1004 is located in the floating device housing 602*c*. Similarly as well, at block 908, the device location identification engine 804 may receive the floating device location identification information from the floating device 1006 that identifies that the floating device 1006 is located in the floating device housing 602*d*.

With reference to the embodiment discussed above in which the floating devices 1100-1106/500 transmit the floating device location identification information that includes wireless device location identifying information signals, at block 908 the device location identification engine 804 in the remote access controller subsystem 800/704 may receive the floating device location identification information via its communication system 808 and use the floating device housing/wireless signal characteristic associations in its device location identification database 806 to determine the relative location of that floating device in the chassis 700. As such, at block 908, the device location identification engine 804 may receive the wireless device location identifying information signals 1108 from the floating device 500/1100, identify the wireless signal characteristics of those wireless device location identifying information signals 1108, and use the floating device housing/wireless signal characteristic associations in its device location identification database 806 to determine the floating device housing in the chassis housing 702 of the chassis 700 in which that floating device 500/1100 is located.

Similarly, at block 908, the device location identification engine 804 may receive the wireless device location identifying information signals 1110 from the floating device 500/1102, identify the wireless signal characteristics of those wireless device location identifying information signals 1110, and use the floating device housing/wireless signal characteristic associations in its device location identification database 806 to determine the floating device housing in the chassis housing 702 of the chassis 700 in which that floating device 500/1102 is located. Similarly, at block 908, the device location identification engine 804 may receive the wireless device location identifying information signals 1112 from the floating device 500/1104, identify the wireless signal characteristics of those wireless device location identifying information signals 1112, and use the floating device housing/wireless signal characteristic associations in its device location identification database 806 to determine the floating device housing in the chassis housing 702 of the chassis 700 in which that floating device 500/1104 is located. Similarly, at block 908, the device location identification engine 804 may receive the wireless device location identifying information signals 1114 from the floating device 500/1106, identify the wireless signal characteristics of those wireless device location identifying information signals 1114, and use the floating device housing/wireless signal characteristic associations in its device location identification database 806 to determine the floating device housing in the chassis housing 702 of the chassis 700 in which that floating device 500/1106 is located.

Following the determination of the relative location of any of the floating devices in the chassis 600 or 700, a variety of operations may be performed. For example, the identity of each floating device connected to the remote access controller subsystem 614/704/800 via a respective cabling subsystem (e.g., as illustrated in FIGS. 10A and 11A) may be reported to the remote access controller subsystem 614/704/800 through that cabling subsystem, which allows the remote access controller subsystem 614/704/800 to access a list of valid configurations in the device location identification database 806 in order determine whether each cabling subsystem is connected to the floating device in an expected location in the chassis based on the list of valid configurations, thus ensuring that each cable is connected to a desired corresponding floating device endpoint. Furthermore, the remote access controller subsystem 614/704/800 may utilize a combination of the relative location of a floating device and the cabled connection of that floating device to the circuit board 702 to configure components on that floating device (e.g., the add-in card connectors 210 or 510). For example, a controller may be configured by the remote access controller subsystem via an $I_2C$ connection in order to change firmware or other parameters of that controller.

As would be appreciated by one of skill in the art in possession of the present disclosure, the connection of endpoints in a computing device via cables provides the possibility that a customer or factory will mis-configure the cables and, for example, generate errors associate with the reporting of resources and system inventory, in the diagnosis of computing device issues, and/or other issues known in the art. The floating device locating mechanism of the present disclosure allows the management subsystem and BIOS in the computing device to verify that cables are connected properly to desired floating devices/endpoints, which may provide for the construction of a slot map of the computing device that allows for proper inventory operations that identify slot numbers and report errors such, as, for example, the failure of an add-in card, local failures of a controller device on a floating device card, and/or other errors that would be apparent to one of skill in the art in possession of the present disclosure.

Thus, systems and methods have been described that provide for the identification of the relative location of a riser card within a server chassis via the transmission by that riser card of riser card location identifying information that may be based on, for example, a portion of the server chassis engaged by that riser card. For example, the riser card location identification system of the present disclosure includes a server chassis that defines a plurality of riser card housings, and that includes a respective server chassis location identification feature that is located adjacent each riser card housing and that is configured to identify the relative location of that riser card housing in the server chassis. A riser card may be positioned in a first riser card housing defined by the server chassis and adjacent a first server chassis location identification feature that is included in the server chassis adjacent that first riser card housing. The riser card includes at least one riser card cabling connector that is connected via a cabling subsystem to a riser card location identification subsystem, and a plurality of server chassis engagement elements that are coupled to the at least one riser card cabling connector and that engage the first server chassis location identification feature. The riser card transmits riser card location identifying information to the riser card location identification subsystem that is based on the engagement of the plurality of serve chassis engagement elements and the first server chassis location identification feature and that identifies a relative location of the riser card in the server chassis. As such, riser card that may be positioned in a variety of different locations within a server chassis may have their location identified, thus allowing the configuration of those riser cards based on their identified location.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A floating device location identification system, comprising:
    a chassis that defines a plurality of floating device housings, wherein the chassis includes a respective chassis location identification feature that is located adjacent each floating device housing and that is not configured to receive data and transmit that data to any other subsystem in the chassis, and wherein each respective chassis location identification feature includes a different physical configuration that is configured to identify the relative location of that floating device housing in the chassis;
    a device location identification subsystem that is located in the chassis; and
    a first floating device that is positioned in a first floating device housing defined by the chassis and adjacent a first chassis location identification feature that is included in the chassis adjacent the first floating device housing, wherein the first floating device includes:
        at least one first floating device cabling connector that is connected via a first cabling subsystem to the device location identification subsystem; and
        a plurality of first chassis engagement elements that are coupled to the at least one first floating device cabling connector and that engage the first chassis location identification feature, wherein the first floating device transmits first floating device location identifying information to the device location identification subsystem that is based on the engagement of the plurality of first chassis engagement elements and the physical configuration of the first chassis location identification feature and that identifies a relative location of the first floating device in the chassis.

2. The system of claim 1, wherein the plurality of first chassis engagement elements are directly connected to the at least one first floating device cabling connector, and wherein the first floating device location identifying information that is transmitted to the device location identification subsystem identifies the plurality of first chassis engagement elements that engage the first chassis location identification feature.

3. The system of claim 2, wherein the device location identification subsystem includes a device location identification database that stores associations between each floating device housing and the chassis location identification feature that is located adjacent that floating device housing, and wherein the device location identification subsystem is configured to:
- identify the first chassis location identification feature based on the identification of the plurality of first chassis engagement elements that engage the first chassis location identification feature; and
- identify the first floating device housing based on the association of the first floating device housing and the first chassis location identification feature in the device location identification database.

4. The system of claim 1, wherein the first floating device includes a device location identification database that stores associations between each floating device housing and the chassis location identification feature that is located adjacent that floating device housing, and wherein the first floating device is configured to:
- identify the first chassis location identification feature based on the plurality of first chassis engagement elements that engage the first chassis location identification feature; and
- generate the first floating device location identifying information that identifies the first floating device housing based on the association of the first floating device housing and the first chassis location identification feature in the device location identification database.

5. The system of claim 1, further comprising:
a second floating device that is positioned in a second floating device housing defined by the chassis and adjacent a second chassis location identification feature that is included in the chassis adjacent the second floating device housing, wherein the second floating device includes:
- at least one second floating device cabling connector that is connected via a second cabling subsystem to the device location identification subsystem; and
- a plurality of second chassis engagement elements that are coupled to the at least one second floating device cabling connector and that engage the second chassis location identification feature, wherein the second floating device transmits second floating device location identifying information to the device location identification subsystem that is based on the engagement of the plurality of second chassis engagement elements and the physical configuration of the second chassis location identification feature and that identifies a relative location of the second floating device in the chassis.

6. The system of claim 5, wherein the engagement of the plurality of first chassis engagement elements and the first chassis location identification feature provides a first sequence of floating device/chassis contact points that identifies the relative location of the first floating device in the chassis, and wherein the engagement of the plurality of second chassis engagement elements and the second chassis location identification feature provides a second sequence of floating device/chassis contact points that is different than the first sequence of floating device/chassis contact points and that identifies the relative location of the second floating device in the chassis.

7. An Information Handling System (IHS), comprising:
a chassis;
a plurality of floating device housings defined by the chassis;
a respective chassis location identification feature that is located adjacent each floating device housing and that is not configured to receive data and transmit that data to any other subsystem in the chassis, wherein each respective chassis location identification feature includes a different physical configuration that is configured to identify the relative location of that floating device housing in the chassis;
a processing system that is housed in the chassis; and
a memory system that is coupled to the processing system and that includes instructions that, when executed by the processing system, cause the processing system to provide a device location identification engine that is configured to:
- receive, from a first floating device that is positioned in a first floating device housing defined by the chassis and adjacent a first chassis location identification feature that is included in the chassis adjacent the first floating device housing, first floating device location identifying information that is based on the engagement of a plurality of first chassis engagement elements on the first floating device and the physical configuration of the first chassis location identification feature; and
- identify, based on the first floating device location identifying information, a relative location of the first floating device in the chassis.

8. The IHS of claim 7, wherein the first floating device location identifying information is received via a first cabling subsystem that is connected to a first floating device connector on the first floating device, and wherein the first floating device location identifying information identifies the plurality of first chassis engagement elements that engage the first chassis location identification feature.

9. The IHS of claim 8, further comprising:
a device location identification database that stores associations between each floating device housing and the chassis location identification feature that is located adjacent that floating device housing, and wherein the device location identification engine is configured to:
- identify the first chassis location identification feature based on the identification of the plurality of first chassis engagement elements that engage the first chassis location identification feature; and
- identify the first floating device housing based on the association of the first floating device housing and the first chassis location identification feature in the device location identification database.

10. The IHS of claim 7, wherein the first floating device location identifying information identifies the first floating device housing.

11. The IHS of claim 7, wherein the device location identification engine is configured to:
receive, from a second floating device that is positioned in a second floating device housing defined by the chassis and adjacent a second chassis location identification feature that is included in the chassis adjacent the second floating device housing, second floating device location identifying information that is based on the engagement of a plurality of second chassis engagement elements on the physical configuration of the second floating device and the second chassis location identification feature; and identify, based on the second floating device location identifying information, a relative location of the second floating device in the chassis.

12. The IHS of claim 7, wherein the engagement of the plurality of first chassis engagement elements and the first chassis location identification feature provides a first sequence of floating device/chassis contact points that identifies the relative location of the first floating device in the chassis, and wherein the engagement of the plurality of second chassis engagement elements and the second chassis location identification feature provides a second sequence of floating device/chassis contact points that is different than the first sequence of floating device/chassis contact points and that identifies the relative location of the second floating device in the chassis.

13. The IHS of claim 7, further comprising:
a remote access controller system that includes the processing system and the memory system.

14. A method for identifying the location of a floating device, comprising:
engaging, by a first chassis location identification feature that is included in a chassis adjacent a first floating device housing defined by the chassis and that includes a physical configuration that is different from a second chassis location identification feature that is included in the chassis adjacent a second floating device housing defined by the chassis, a plurality of first chassis engagement elements that are included on a first floating device that is positioned in the first floating device housing defined by the chassis, wherein neither of the first chassis location identification feature and the second chassis location identification feature are configured to receive data and transmit that data to any other subsystem in the chassis;

receiving, by a device location identification subsystem from the first floating device, first floating device location identifying information that is based on the engagement of the plurality of first chassis engagement elements on the first floating device and the physical configuration of the first chassis location identification feature; and identifying, by the device location identification subsystem based on the first floating device location identifying information, a relative location of the first floating device in the chassis.

15. The method of claim 14, wherein the first floating device location identifying information is received via a first cabling subsystem that is connected to a first floating device connector on the first floating device, and wherein the first floating device location identifying information identifies the plurality of first chassis engagement elements that engage the first chassis location identification feature.

16. The method of claim 15, further comprising:
identifying, by the device location identification subsystem, the first chassis location identification feature based on the identification of the plurality of first chassis engagement elements that engage the first chassis location identification feature; and identifying, by the device location identification subsystem using a device location identification database that stores associations between each floating device housing defined by the chassis and respective chassis location identification features that are located adjacent those floating device housings, the first floating device housing based on the association of the first floating device housing and the first chassis location identification feature in the device location identification database.

17. The method of claim 14, wherein the first floating device location identifying information identifies the first floating device housing.

18. The method of claim 14, further comprising:
engaging, by the second chassis location identification feature that is included in the chassis adjacent the second floating device housing defined by the chassis, a plurality of second chassis engagement elements that are included on a second floating device that is positioned in the second floating device housing defined by the chassis;

receiving, by the device location identification subsystem from the second floating device, second floating device location identifying information that is based on the engagement of the plurality of second chassis engagement elements on the second floating device and the physical configuration of the second chassis location identification feature; and identifying, by the device location identification subsystem based on the second floating device location identifying information, a relative location of the second floating device in the chassis.

19. The method of claim 18, wherein the engagement of the plurality of first chassis engagement elements and the first chassis location identification feature provides a first sequence of floating device/chassis contact points that identifies the relative location of the first floating device in the chassis, and wherein the engagement of the plurality of second chassis engagement elements and the second chassis location identification feature provides a second sequence of floating device/chassis contact points that is different than the first sequence of floating device/chassis contact points and that identifies the relative location of the second floating device in the chassis.

20. The method of claim 14, wherein the device location identification subsystem is provided by a remote access controller subsystem that is housed in the chassis.

* * * * *